United States Patent
Robin et al.

(10) Patent No.: US 9,601,542 B2
(45) Date of Patent: Mar. 21, 2017

(54) P-N JUNCTION OPTOELECTRONIC DEVICE FOR IONIZING DOPANTS BY FIELD EFFECT

(71) Applicant: Commissariat a L'Energie Atomique et aux Energies Alternatives, Paris (FR)

(72) Inventors: Ivan-Christophe Robin, Grenoble (FR); Hubert Bono, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/750,156

(22) Filed: Jun. 25, 2015

(65) Prior Publication Data
US 2015/0380461 A1 Dec. 31, 2015

(30) Foreign Application Priority Data
Jun. 27, 2014 (FR) ...................................... 14 56084

(51) Int. Cl.
*H01L 27/15* (2006.01)
*H01L 33/38* (2010.01)
(Continued)

(52) U.S. Cl.
CPC ........ *H01L 27/156* (2013.01); *H01L 27/1443* (2013.01); *H01L 31/022408* (2013.01);
(Continued)

(58) Field of Classification Search
CPC ........ H01L 33/38; H01L 31/10; H01L 27/156
(Continued)

(56) References Cited

U.S. PATENT DOCUMENTS 6,797,988 B2 * 9/2004 Lin ....................... H01L 33/145
257/98
7,474,681 B2 * 1/2009 Lin ..................... H01L 25/0753
250/221
(Continued)

FOREIGN PATENT DOCUMENTS

DE 20 2006 003 360 U1 7/2006
FR 2 992 465 A1 12/2013
(Continued)

OTHER PUBLICATIONS

French Preliminary Search Report issued Nov. 21, 2014 in French Application 14 56084, filed Jun. 27, 2014 (with English Translation of Categories of Cited Documents).
(Continued)

*Primary Examiner* — Jarrett Stark
*Assistant Examiner* — Charles N Ausar-El
(74) *Attorney, Agent, or Firm* — Oblon, McClelland, Maier & Neustadt, L.L.P.

(57) ABSTRACT

An optoelectronic device comprising a mesa structure including:
a first and a second semiconductor portions forming a p-n junction,
a first electrode electrically connected to the first portion which is arranged between the second portion and the first electrode,
the device further comprising:
a second electrode electrically connected to the second portion,
an element able to ionize dopants of the first and/or second semiconductor portion through generating an electric field in the first and/or second semiconductor portion and overlaying at least one part of the side flanks of at least one part of the first and/or second
(Continued)

semiconductor portion and of at least one part of a space charge zone formed by the first and second semiconductor portions, upper faces of the first electrode and of the second electrode form a substantially planar continuous surface.

18 Claims, 13 Drawing Sheets

(51) Int. Cl.
| | |
|---|---|
| *H01L 31/18* | (2006.01) |
| *H01L 31/0352* | (2006.01) |
| *H01L 31/0224* | (2006.01) |
| *H01L 27/144* | (2006.01) |
| *H01L 33/00* | (2010.01) |
| *H01L 31/113* | (2006.01) |
| *H01L 31/10* | (2006.01) |

(52) U.S. Cl.
CPC ........ *H01L 31/03529* (2013.01); *H01L 31/10* (2013.01); *H01L 31/1136* (2013.01); *H01L 31/186* (2013.01); *H01L 33/0041* (2013.01); *H01L 33/38* (2013.01); *Y02E 10/50* (2013.01); *Y02P 70/521* (2015.11)

(58) Field of Classification Search
USPC .......................................................... 257/88
See application file for complete search history.

(56) References Cited

U.S. PATENT DOCUMENTS

| | | | | |
|---|---|---|---|---|
| 7,535,089 | B2* | 5/2009 | Fitzgerald | H01L 21/76254 257/103 |
| 8,436,373 | B2* | 5/2013 | Mizutani | H01L 27/156 257/100 |
| 8,686,447 | B2* | 4/2014 | Tomoda | H01L 25/0753 257/100 |
| 9,166,091 | B2* | 10/2015 | Kopp | H01L 31/0336 |
| 2012/0138969 | A1* | 6/2012 | Moon | H01L 33/382 257/88 |
| 2013/0214363 | A1* | 8/2013 | Nemouchi | H01L 27/092 257/369 |
| 2013/0341677 | A1* | 12/2013 | Nie | H01L 21/8252 257/192 |
| 2014/0097401 | A1 | 4/2014 | Robin | |
| 2014/0120702 | A1 | 5/2014 | Vaufrey et al. | |
| 2014/0159063 | A1* | 6/2014 | Odnoblyudov | H01L 27/156 257/88 |
| 2014/0191241 | A1* | 7/2014 | Edwards | H01L 27/098 257/76 |
| 2014/0191242 | A1* | 7/2014 | Nie | H01L 29/8083 257/76 |
| 2015/0060904 | A1 | 3/2015 | Robin et al. | |
| 2015/0155331 | A1* | 6/2015 | Guenard | H01L 27/153 257/93 |
| 2015/0380459 | A1* | 12/2015 | Bono | H01L 31/02005 257/13 |

FOREIGN PATENT DOCUMENTS

| | | |
|---|---|---|
| WO | WO 2009/128777 A1 | 10/2009 |
| WO | WO2013189949 A1 * | 12/2013 |

OTHER PUBLICATIONS

J.D. Thomson et al. "The Influence of Acceptor Anneal Temperature on the Performance of InGaN/GaN Quantum Well Light-Emitting Diodes", Journal of Applied Physics, vol. 99, 2006, 7 pages.

S. Koizumi et al. "Growth and Characterization of Phosphorous Doped {111} Homoepitaxial Diamond Thin Films", Applied Physics Letters, vol. 71, No. 8, Aug. 25, 1997, 4 pages.

W. Gotz et al. "Activation of Acceptors in Mg-Doped GaN Grown by Metalorganic Chemical Vapor Deposition", Applied Physics Letters, vol. 68, No. 5, Jan. 29, 1996, 3 pages.

Asif Khan et al. "Ultraviolet Light-Emitting Diodes Based on Group Three Nitrides", Nature Photonics, vol. 2, Feb. 2008, 8 pages.

Ashish Kumar et al. "Temperature Dependence of Electrical Characteristics of Pt/GaN Schottky Diode Fabricated by UHV E-Beam Evaporation", Nanoscale Research Letters, vol. 8, 2013, 7 pages.

A. Y. Polyakov et al. "Comparison of Electrical Properties and Deep Traps in p-$Al_xGa_{1-x}N$ Grown by Molecular Beam Epitaxy and Metal Organic Chemical Vapor Deposition", Journal of Applied Physics, vol. 106, 2009, 7 pages.

Yoshitaka Taniyasu et al. "Aluminum Nitride Deep-Ultraviolet Light-Emitting P-N Junction Diodes", Diamond and Related Materials, vol. 17, 2008, 5 pages.

* cited by examiner

P-N JUNCTION OPTOELECTRONIC DEVICE FOR IONIZING DOPANTS BY FIELD EFFECT

TECHNICAL FIELD AND PRIOR ART

The invention relates to the field of p-n junction optoelectronic devices such as light-emitting diodes (LEDs or micro-LEDs), particularly used for making any LED-based illuminating device (screens, projectors, video walls, etc.), or photodetecting devices such as photodiodes.

A light-emitting diode emitting a blue light generally includes a GaN-based p-i-n junction comprising: a p-doped GaN layer with typically $10^{19}$ acceptors/cm$^3$, a non-intentionally doped or intrinsic GaN layer, with typically $10^{17}$ donors/cm$^3$ in which InGaN quantum wells are formed, and an n-doped GaN layer with $10^{19}$ donors/cm$^3$. The non-intentionally doped layer including quantum wells in which the light emission occurs is called an active zone. An AlGaN electron blocking layer with an aluminium concentration between 8% and 15% and p-doped can be added between the active zone and the p-doped GaN layer, as described in the document. "The influence of acceptor anneal temperature on the performance of InGaN/GaN quantum well light emitting diodes", J. D. Thomson et al., Journal of Applied Physics 99, 024507 (2006). This electron blocking layer enables the movement of electrons to be limited from the active zone towards the p-doped GaN layer.

The major problem limiting the efficiency of this type of light-emitting diode is the high acceptor activation energy in the p-doped GaN layer, which is typically in the order of 200 meV.

A light-emitting diode emitting in the UV range (UV LED) can be made by using AlGaN to form the p-i-n junction, with GaN quantum wells. The more the aluminium concentration in AlGaN increases, the more the acceptor activation energy in the p-doped AlGaN increases. By way of example, this activation energy is in the order of 600 meV in AlN. The quantity of activated acceptors in AlGaN is then extremely low, accordingly limiting the efficiency of such a UV LED.

In order to reduce the acceptor activation energy in this UV LED, p-doped GaN can be used instead of p-doped AlGaN. However, the drawback thereof is to limit the radiative efficiency in the active zone of the UV LED which is of AlGaN. Moreover, part of the UV light emitted by the active zone is absorbed by the p-doped GaN.

In the above described examples, the observed limitations are due to a high acceptor activation energy in the p-n junction. It is also possible to experience similar problems related to a high donor activation energy when the donors are deep. For example, these problems can be found in the case of LEDs the p-n junctions of which are made of diamond since in this case, donors have a strong ionization energy (in the order of 460 meV).

Furthermore, the above indicated problems can also be found in the same way for photodiodes, for example those intended to make a UV light detection and made from AlGaN or diamond.

DISCLOSURE OF THE INVENTION

Thus there is a need to provide a new type of p-n junction optoelectronic device, for example a light-emitting diode or a photodiode, the emission or detection efficiency of which, or the internal quantum efficiency of which is improved compared to prior art p-n junction optoelectronic devices, especially for semiconducting materials having high acceptor or donor activation energies.

To do so, one embodiment provides an optoelectronic device comprising at least one mesa structure including at least:
  first and a second semiconductor portions, one being p-doped and the other being n-doped, and forming together a p-n junction,
  a first electrode electrically connected to the first semiconductor portion which is arranged between the second semiconductor portion and the first electrode,
the optoelectronic device further comprising at least:
  a second electrode electrically connected to the second semiconductor portion,
  an element able to ionize dopants of the p-n junction, more precisely able to ionize the dopants of the first and/or second semiconductor portion via an electric field generation in the p-n junction, more precisely, in the first and/or second semiconductor portion and overlaying at least one part of the side flanks of at least one part of the first and/or second semiconductor portion located at the p-n junction, more precisely at least one part of the first and/or second semiconductor portion, and at least one part of a space charge zone formed by the first and second semiconductor portions,
  and wherein upper faces of at least the first electrode and of the second electrode form a substantially planar continuous surface.

The presence of the element able to ionize dopants of the p-n junction, or able to ionize dopants of the first and/or second semiconductor portion, near the p- or n-doped semiconductor of the optoelectronic device enables an electric field improving the conductivity of the p- or n-doped semiconductor to be generated. This field effect leads to an ionization of dopants in this semiconductor (acceptor ionization for the p-doped semiconductor or donor ionization for the n-doped semiconductor), which enables the internal quantum efficiency, that is the emission or reception efficiency, of the optoelectronic device to be increased since for example a larger number of acceptors (holes) are available to recombine with donors (electrons) coming from the n-doped semiconductor of the device especially when the p-doped semiconductor has a high acceptor activation energy, or a larger number of donors are available to recombine with acceptors of the p-doped semiconductor particularly when the n-doped semiconductor has a high donor activation energy.

The optoelectronic device may advantageously comprise one or more semiconductors with significant acceptor activation energies, for example equal to or higher than about 50 meV, such as GaN (the acceptor ionization energy value of which is about 200 meV) and InGaN quantum wells (the ionization energy value of which varies as a function of the indium concentration and is between about 50 meV and 200 meV), for example for making a light-emitting diode emitting a blue light, or AlGaN (the acceptor ionization energy value of which is higher than about 200 meV), or AlN (the acceptor ionization energy value of which is equal to about 600 meV), and GaN or AlGaN quantum wells, for example for making a light-emitting diode emitting a UV light or a photodiode detecting UV light. It is also possible to use InGaN as a p-type semiconducting material for some light-emitting diodes.

It is also possible for the optoelectronic device to comprise one or more semiconductors with significant donor activation energies, for example equal to or higher than about 50 meV such as diamond (the donor ionization energy value of which is about 460 meV), for example for making a light-emitting diode or a photodiode operating in the UV range.

The advantage of the large integration of elements of such an optoelectronic device is to minimize the current densities obtained in the electrodes, and therefore to reduce the Joule effect warm-up within the device.

The phrase "mesa structure" refers to the fact that the optoelectronic device is made as a stack of the first and second doped semiconductor portions, a junction area being present between both these doped semiconductor portions, and that this stack is etched along at least one part of its height in the form of an island called "mesa" and able to form pads of any shape comprising such a stack.

Moreover, the substantially planar continuous surface formed by at least the upper faces of the electrodes of the device enables, for example without resorting to inserts such as connecting microbeads, the device to be easily hybridized with another element, such as an electronic circuit which can also have a planar face at which materials similar to those of the device can be found, for example by direct bonding.

The upper faces of the electrodes form a substantially planar continuous surface, that is they are arranged substantially in a same plane. The phrase "substantially planar" is herein used to refer to the fact that the surface formed by these upper faces can have height or thickness variations, between 0 and about 150 nm.

The herein used term "p-n junction" also refers to a p-i-n-type junction.

The space charge zone, or depletion zone, corresponds to the region which appears in the P-N junction, between the N-doped portion and the P-doped portion and which is devoid of free carriers.

The element able to ionize dopants of the p-n junction may include:
  at least one dielectric passivation layer overlaying said at least one part of the side flanks of at least one part of the first and/or second semiconductor portion located at the p-n junction and at least one electrically conductive gate such that the dielectric passivation layer is arranged between the gate and said at least one part of the first and/or second semiconductor portion, and/or
  at least one metallic portion overlaying said at least one part of the side flanks of at least one part of the first and/or second semiconductor portion located at the p-n junction and forming a Schottky contact with said at least one part of the first and/or second semiconductor portion.

The element able to ionize dopants of the first and/or second semiconductor portion may comprise:
  at least one dielectric passivation layer overlaying said at least one part of the side flanks of at least one part of the first and/or second semiconductor portion and of at least one part of the space charge zone, and at least one electrically conductive gate such that the dielectric passivation layer is arranged between the gate and said at least one part of the first and/or second semiconductor portion and between the gate and said at least one part of the space charge zone, and/or
  at least one metallic portion overlaying said at least one part of the side flanks of at least one part of the first and/or second semiconductor portion and of at least one part of the space charge zone and forming a Schottky contact with said at least one part of the first and/or second semiconductor portion and with said at least one part of the space charge zone.

In this case, the optoelectronic device may be such that:
  a first part of the dielectric passivation layer laterally surrounds at least partly the first electrode, the first semiconductor portion, and at least one part of the second semiconductor portion,
  the gate laterally overlays the first part of the dielectric passivation layer,
  a second part of the dielectric passivation layer laterally overlays the gate (the gate may be arranged between the first and the second parts of the dielectric passivation layer), and
  the second electrode laterally overlays the second part of the dielectric passivation layer,
or the optoelectronic device may be such that:
  the metallic portion laterally surrounds at least partly the first electrode, the first semiconductor portion, and at least part of the second semiconductor portion, and
  the second electrode laterally overlays the metallic portion.

In this case, the substantially planar continuous surface may be formed by the upper faces of the electrodes, of the gate, and of the dielectric passivation layer, or by the upper faces of the electrodes and of the metallic portion. Slight height or thickness variations may originate from a chemical-mechanical planarization (CMP) implemented in the presence of the materials of the electrodes, of the gate and of the dielectric passivation layer, the etch rates of the conductive materials of the electrodes (and possibly of the gate when the latter is exposed at the upper face of the device) being different from the one of the dielectric material of the passivation layer. One advantage of these slight height or thickness variations, between the upper faces of the dielectric passivation layer and those of the electrodes, can be the provision of an excellent insulation between the electrodes of the device and/or against the gate and/or electrodes or gates of adjacent diodes when depressions are located at the upper faces of the electrodes and/or of the gate.

The optoelectronic device may comprise:
  several mesa structures,
  several dielectric passivation layers each overlaying at least one part of the side flanks of at least one part of the first and/or second semiconductor portion located at the p-n junction of one of the mesa structures, that is at least one part of the side flanks of at least one part of the first and/or second semiconductor portion and of at least one part of the space charge zone of one of the mesa structure, and several electrically conductive gates such that each dielectric passivation layer is arranged between one of the gates and said at least one part of the first and/or second semiconductor portion of one of the mesa structure and between one of the gates and said at least one part of the space charge zone of one of the mesa structures, or several metallic portions each overlaying at least one part of the side flanks of at least one part of the first and/or second semiconductor portion located at the p-n junction of one of the mesa structures, that is at least one part of the side flanks of at least one part of the first and/or second semiconductor portion and of at least one part of the space charge zone of one of the mesa structures, and the second electrode may be electrically connected to the second semiconductor portion of each of the mesa structures, and the upper faces of at least the first electrode of each mesa structure and of the second electrode may form the substantially planar continuous surface.

In this case:
each of the mesa structures may be at least partly laterally surrounded by a first part of one of the dielectric passivation layers,
each gate may laterally overlay the first part of one of the dielectric passivation layers,
a second part of each dielectric passivation layer may laterally overlay one of the gates (which is thus arranged between the first and the second part of one of the dielectric passivation layers), and
the second electrode may laterally overlay the second parts of the dielectric passivation layers,
or:
each mesa structure may be at least partly laterally surrounded by one of the metallic portions, and
the second electrode may laterally overlay the metallic portions.

Alternatively:
the gate may comprise at least one portion of at least one electrically conductive material extending in the mesa structure, or the metallic portion may extend in the mesa structure, and
the second electrode may be arranged around the mesa structure.

The optoelectronic device may comprise several mesa structures, and:
the gate may comprise several portions of at least one electrically conductive material extending in one or several of the mesa structures, or several metallic portions may extend in one or several of the mesa structures, and
the second electrode may be arranged around the or each of the mesa structures.

The optoelectronic device may further comprise an electrical contact arranged next to the mesa structure(s) and next to the second electrode, and to which the gate(s) and the metallic portion(s) are electrically connected.

The substantially planar continuous surface may be further formed by upper face(s) of the gate(s) or of the metallic portion(s), and/or by upper faces of the dielectric passivation layer(s), and/or the or each dielectric passivation layer may overlay an upper face of the or each gate.

The dielectric passivation layer may overlay an upper face of the gate.

The optoelectronic device may further comprise at least one buffer layer comprising a semiconductor doped according to the same conductivity type as the second semiconductor portion and on which the second semiconductor portion and the second electrode are arranged next to each other.

The optoelectronic device may further comprise a second doped semiconductor layer comprising a structured upper face a first protruding part of which forms the second semiconductor portion, and the second electrode may be arranged on at least a second part of the second doped semiconductor layer forming a depression, or hollow, of the structured face of the second doped semiconductor layer.

Alternatively, a first part of the second semiconductor portion arranged between a second part of the second semiconductor portion and the first semiconductor portion may form a recess relative to the second part of the second semiconductor portion, and the second electrode may be electrically connected to the second semiconductor portion at an upper face of the second part of the second semiconductor portion.

The first semiconductor portion may be p-doped and may comprise at least one semiconductor an acceptor activation energy of which is equal to or higher than about 200 meV, or the first semiconductor portion may be n-doped and may comprise at least one semiconductor a donor activation energy of which is equal to or higher than about 200 meV.

Another embodiment relates to an electronic device comprising one or several optoelectronic devices such as above described and corresponding to one or several light-emitting diodes and/or one or several photodiodes.

Another embodiment relates to a method of light emission from an optoelectronic device such as above described, comprising implementing a biasing, or a polarization, of the optoelectronic device by applying an electrical voltage between the first electrode(s) and the second electrode of the optoelectronic device, and:
applying an electric potential difference between the gate(s) or metallic portions and the electrode(s) electrically connected to the p-doped semiconductor portion(s) such that the electric potential applied to the gate(s) or metallic portion(s) is equal to or lower than the electric potential applied to the electrode(s) electrically connected to the p-doped semiconductor portion(s), or
applying an electric potential difference between the gate(s) or metallic portions and the electrode(s) electrically connected to the n-doped semiconductor portion(s) such that the electric potential applied to the gate(s) or metallic portions is equal to or higher than the electric potential applied to the electrode(s) electrically connected to the n-doped semiconductor portion(s).

Another embodiment relates to a method of photoelectric conversion from an optoelectronic device such as described below, comprising:
applying an electric potential difference between the gate(s) or metallic portions and the electrode(s) electrically connected to the p-doped semiconductor portion(s) such that the electric potential applied on the gate(s) or metallic portions is equal to or lower than the electric potential applied to the gate(s) or metallic portions is equal to or lower than the electric potential applied to the electrode(s) electrically connected to the p-doped semiconductor portion(s), or
applying an electric potential difference between the gate(s) or metallic portion(s) and the electrode(s) electrically connected to the n-doped semiconductor portion(s) such that the electric potential applied to the gate(s) or metallic portions is higher than or equal to the electric potential applied to the electrode(s) electrically connected the n-doped semiconductor portion(s).

Another embodiment relates to a method for making an optoelectronic device comprising at least the steps of:
making a layer stack including at least one first semiconductor layer arranged between a second semiconductor layer and an electrically conductive layer, one of the first and second semiconductor layers being p-doped and the other of the first and second semiconductor layers being n-doped,
etching the layer stack, making at least one mesa structure including a first and a second semiconductor portions forming a p-n junction and a first electrode electrically connected to the first semiconductor portion,
making an element able to ionize dopants of the p-n junction, or able to ionize dopants of the first and/or second semiconductor portion, through a generation of an electric field in the p-n junction, or in the first and/or second semiconductor portion and overlaying at least one part of the side flanks of at least one part of the first and/or second semiconductor portion located at the p-n junction, that is at least one part of the side flanks of at least one part of the first and/or second semiconductor portion and of at least one part of a space charge zone formed by the first and second semiconductor portions, making a second electrode electrically connected to the second semiconductor portion, and wherein making the second electrode comprises a step of planarizing an electrically conductive material such that upper faces of at least the first electrode and the second electrode form a substantially planar continuous surface.

The advantage of such a method, beside those obtained thanks to the presence of the element able to ionize dopants of the p-n junction, is to require a limited number of steps for its implementation.

A method for making an electronic device is also described, comprising implementing a method for making at least one optoelectronic device such as above described.

BRIEF DESCRIPTION OF THE DRAWINGS

The present invention will be better understood upon reading the description of exemplary embodiments given by way of purely indicative and in no way limiting purposes with reference to the accompanying drawings in which.

Identical, similar, or equivalent parts of the different figures described thereafter bear the same reference numerals so as to facilitate switching from one figure to the other.

The different parts represented in the figures are not necessarily drawn to a uniform scale, in order to make the figures more understandable.

The different possibilities (alternatives and embodiments) must be understood as not being exclusive from one another and can be combined to each other.

DETAILED DISCLOSURE OF PARTICULAR EMBODIMENTS

Figure 1:
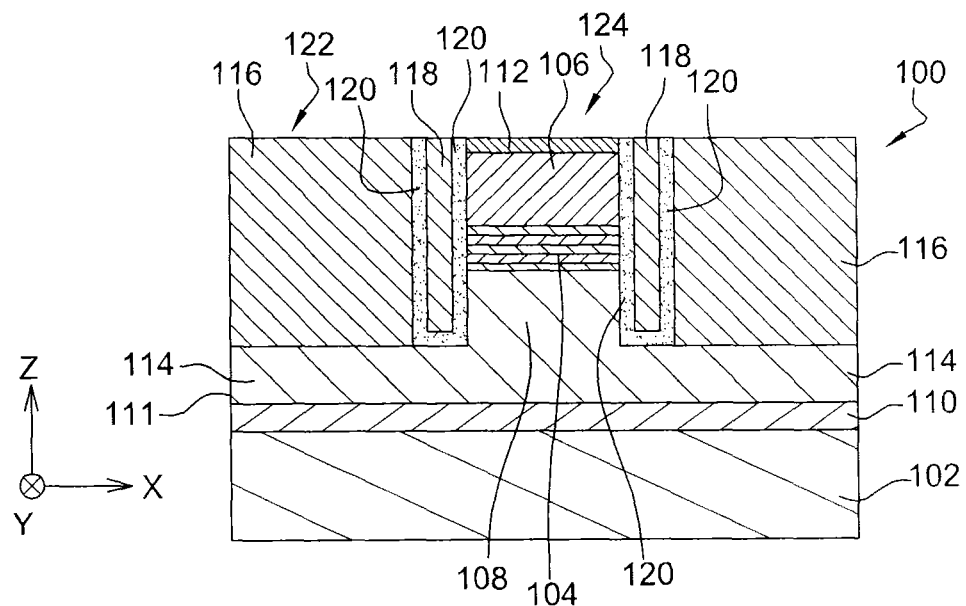
FIG. 1 schematically depicts an optoelectronic device according to a first embodiment.

FIG. 1 schematically depicts an optoelectronic device 100 according to a first embodiment. In this first embodiment, the optoelectronic device 100 corresponds to a light-emitting diode, or LED.

The LED 100 comprises a substrate 102, for example sapphire-based, for acting as a support for growing the other layers of the LED 100.

The LED 100 comprises an active zone 104 comprising one or several emitting layers each forming a quantum well, for example comprising InGaN, and each being arranged between two barrier layers, for example comprising GaN. InGaN for example comprises 16% of indium. All the layers of the active zone 104, that is the emitting layer(s) an the barrier layer(s), comprise intrinsic semiconducting materials, i.e. they are non-intentionally doped (having a residual donor concentration $n_{nid}$ for example equal to about $10^{17}$ donors/cm$^3$, or between about $10^{15}$ and $10^{18}$ donors/cm$^3$). The thickness of the or each emitting layers is for example equal to about 2 nm and more generally between about 0.5 nm and 10 nm, and the thickness of each barrier layer is for example equal to about 5 nm or between about 1 nm and 25 nm. The space charge zone is mainly located in this active zone 104.

The active zone 104 is arranged between a first semiconductor portion 106 which is p-doped, and a second semiconductor portion 108 which is n-doped, both semiconductor portions 106 and 108 forming the p-n junction of the LED 100 (or more precisely the p-i-n junction considering the active zone 104). The semiconductor portions 106 and 108 comprise for example GaN. The first portion 106 is p-doped with an acceptor concentration (holes) for example between about $10^{17}$ and $5.10^{19}$ acceptors/cm$^3$, and herein equal to $10^{17}$ acceptors/cm$^3$. The second portion 108 is n-doped with a donor concentration (electrons) for example between about $10^{17}$ and $5.10^{19}$ donors/cm$^3$, and herein equal to $10^{17}$ donors/cm$^3$. Both semiconductor portions 108 and 106 each have for example a thickness between about 20 nm and 10 μm. In the example herein described, the first semiconductor portion 106 has a thickness equal to about 500 nm, and the second semiconductor portion 108 has a thickness equal to about 100 nm. The second semiconductor portion 108 is arranged on a buffer layer 110, for example comprising n-doped GaN with a concentration equal for example to about $10^{19}$ donors/cm$^3$, and having a thickness equal to about 2 μm. The buffer layer 110 generally comprises the same semiconductor and the same doping type as the second portion 108.

Semiconducting materials other than GaN and InGaN can be used to make the LED 100, particularly according to the range of wavelengths intended to be emitted by the LED 100.

The LED 100 also comprises a first portion of electrically conductive material, herein a metallic portion, arranged on the first semiconductor portion 106 and electrically connected to the latter, thus forming a first electrode 112, herein an anode, of the LED 100.

The LED 100 is made by implementing an etching of a stack of different layers for forming the above described elements of the LED 100. In this first embodiment, the second semiconductor layer 111 forming the second semiconductor portion 108 is not however etched throughout its thickness in order to keep parts 114 of this second semiconductor layer 111 adjacent to the second semiconductor portion 108 so that these n-doped semiconductor parts 114 are electrically connected to a second electrode 116 of the LED 100, which herein corresponds to the cathode since the second portion 108 is n-doped. The second electrode 116 comprises for example a titanium layer with a thickness equal to about 20 nm overlaid by an aluminium layer.

The second semiconductor layer 111 forming the second semiconductor portion 108 and the parts 114 can be seen as comprising a structured upper face a first protruding part of which forms the second semiconductor portion 108, the second electrode 116 being arranged on the second parts 114 of the second semiconductor layer 111 forming depressions, or hollows, of the structured face of this layer. Alternatively, the second semiconductor portion 108 and the parts 114 can be made from two distinct semiconductor layers superimposed one on top of the other. In this case, the semiconductor layer for forming the second portion 108 is etched throughout its thickness, and the one forming the parts 114 is not etched (or can be partly etched).

The first electrode 112, the first semiconductor portion 106, the active zone 104 and the second semiconductor portion 108 of the LED 100 form a mesa structure 124, that is a stack as an island, arranged on the substrate 104 (and on the buffer layer 110). The mesa structure 124 of the LED 100 has a section, in a plane parallel to the face of the substrate 102 on which this structure lies (plane parallel to the plane (X, Y) depicted in FIG. 1), having a disk shape or a rectangular shape or any other shape, whether polygonal or not. The mesa structure 124 can therefore form an island, or a pad, having a cylindrical, parallelepiped, etc. shape. The mesa structure 124 can also have an elongated shape, rectilinear or not, or any other shape adapted to make a light-emitting diode.

The mesa structure 124 of the LED 100 is surrounded by an electrically conductive gate 118. The gate 118 is formed by one or several electrically conductive materials, for example one or several metals such as aluminium. The gate 118 thickness (dimension along the axis X depicted in FIG. 1, that is the dimension perpendicular to the side flanks of the mesa structure 124) is for example equal to about 100 nm, or between about 3 nm and 10 μm. This gate 118 is electrically insulated from the p-i-n junction of the LED 100 (that is the elements 104, 106, and 108) as well as from the electrodes 112 and 116 and from the n-doped semiconductor parts 114 by a dielectric passivation layer 120 comprising for example SiN and having a thickness equal to about 10 nm. The gate 118 which surrounds the mesa structure 124 of the LED 100 is in turn surrounded by the second electrode 116. A first part of the dielectric passivation layer 120 is arranged between the side flanks of the mesa structure 124 and the gate 118, and a second part of the dielectric passivation layer 120 is arranged between the gate 118 and the second electrode 116. Except for the upper face of the gate 118, the other faces of the gate 118 are in contact with the dielectric passivation layer 120.

Given the mesa structure 124 of the LED 100 and the geometry of the second electrode 116, of the gate 118 and of the dielectric passivation layer 120, the upper faces (located at the apex of the LED 100) of the first electrode 112, of the dielectric passivation layer 120, of the gate 118 and of the second electrode 116 form together a substantially planar surface 122, that is they are substantially arranged in a same plane. Given a step of planarizing the electrically conductive material of the second electrode 116 implemented during the making of the LED 100 (step described latter in connection with the method of making), the upper faces of the first electrode 112, of the gate 118 and of the second electrode 116 can possibly have depressions, or hollows, with a depth (with respect to the upper faces of the dielectric passivation layer 120) between 0 (no depression) and about 150 nm. This substantially planar surface 122 is well adapted to be directly hybridized with another element, for example an electronic circuit comprising electrical contacts intended to be coupled, for example by metal-metal direct bonding, to the anode and the cathode of the LED 100, and dielectric zones intended to be coupled, also by dielectric-dielectric direct bonding, particularly to the dielectric passivation layer 120.

The operating principle of such a LED 100 which differs from a conventional LED, particularly because of the presence of the gate 118 around the mesa structure 124, is described thereafter.

The gate 118 arranged around the junction of the LED 100 enables a field effect to be made controlling ionization of dopants in the junction. Actually, the electric field generated by the gate 118 arranged around the junction of the LED 100 enables the acceptors of the first semiconductor portion 106 which is p-doped to be ionized and the recombination efficiency to be increased by injecting more holes in the active zone 104.

The gate 118 is arranged around at least one part of the first semiconductor portion 106 which is located near the junction of the LED 100, that is at least the part of the first portion 106 in contact with the active zone 104 in the example of FIG. 1, so as to ionize the acceptors by field effect at the gate surface at least at this part of the first portion 106.

Figure 2:
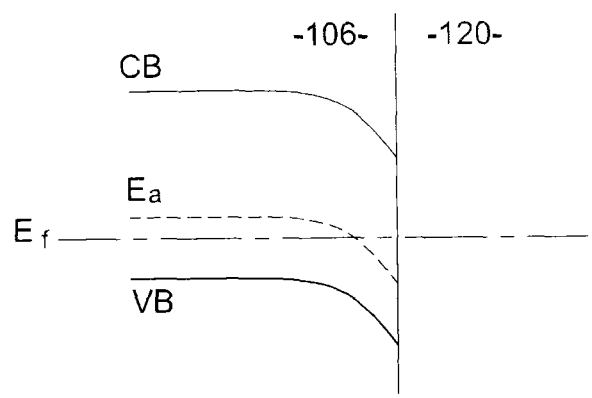
FIG. 2 schematically depicts the band curvature phenomenon occurring in a light-emitting diode.

In order to make the electric field, a potential difference is applied between the first electrode 112, forming the anode of the LED 100, and the gate 118 of the LED 100, which generates an electric field. In the case of a field effect transistor, the electric field generated by the gate enables the conductivity type of a zone to be reversed and a conduction channel to be made. Here, the electric field does not reverse the conductivity of the first p-doped semiconductor portion 106, but emphasizes its conductivity. Actually, the quantity of ionized acceptors is set by the level position of acceptors with respect to the Fermi level. Changing the surface potential curves the material bands of the second portion 106. The acceptor level is fixed with respect to the valence band. Particularly, if the surface potential is reduced by applying to the gate 118 an electric potential lower than the one applied to the anode 112, this curves the bands towards the negative energies such that, near the surface, the acceptor level in the first p-doped semiconductor material portion 106 can fall (but not necessarily) under the Fermi level. Near the surface, all the acceptors are then ionized. These valance band VB curvature, having a conduction CB, and of acceptor energy Ea with respect to the Fermi level Ef is schematically depicted in FIG. 2 at the interface between the first p-doped semiconductor portion 106 and the dielectric passivation layer 120 when the electric potential applied to the gate 118 is lower than the one applied to the anode 112.

The more significant the difference between the potentials applied to the gate 118 and to the anode 112, the more deeply the acceptors are ionized. The ionized acceptors release holes which can recombine in the active zone 104 with electrons coming from the second n-doped semiconductor portion 108 and make photons. Ionizing the acceptors on the surface by field effect therefore increases the internal quantum efficiency of the LED 100 because more holes are available to recombine with the electrons coming from the n-doped semiconductor region.

The diameter of the mesa structure 124, or the dimension of the sides of the mesa structure 124 which are perpendicular to the gate 118, is preferably equal to or lower than about 50 μm when the mesa structure 124 comprises GaN, due to the fact that the influence zone of the gate 118, that is the distance up to which the gate 118 can ionize acceptors in the p-doped semiconductor of the first portion 106, is in this order. When AlGaN is used, for example in the case of a GaN or AlGaN active zone 104 with AlGaN quantum wells (with in this case an aluminium concentration lower than the one in the barrier layers) or GaN quantum wells, requiring in this case more significant acceptor ionization energies and therefore a need for a stronger electric field, the diameter, or the dimension of the sides surrounded by the gate 118, of the mesa structure 124 of the LED 100 is preferably equal to or lower than about 5 µm. In any case, it is advantageous for the diameter, or the dimension of the sides surrounded by the gate 118, of the mesa structure 124 of the LED 100, to be equal to or lower than about 5 µm.

Simulations of the internal quantum efficiency of the LED 100 carried out with the Atlas Silvaco software are described below.

Figure 3:
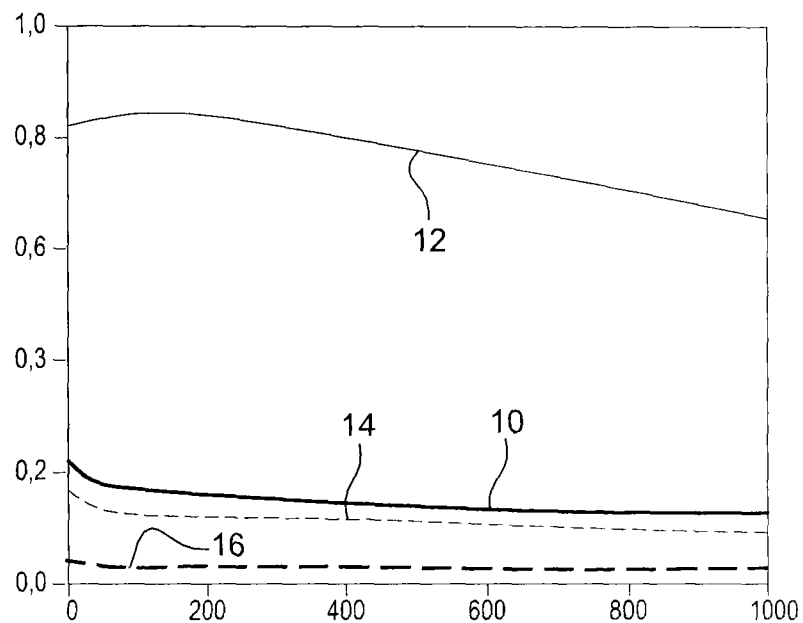
FIGS. 3 to 9 depict the internal quantum efficiency obtained as a function of the current density in different light-emitting diodes for different values of a potential difference between the gate and the anode of these light-emitting diodes.

FIG. 3 depicts the internal quantum efficiency obtained in a mesa structure LED and comprising a gate surrounding the p-doped semiconductor portion, as a function of the current density, in A/cm$^2$, in the LED for different values of a potential difference Vg applied between the gate and the anode (Vg=$V_{gate}$–$V_{anode}$). The LED used for this simulation comprises several structural differences with respect to the LED 100 described in relation with FIG. 1:

the simulated LED does not comprise the parts 114 and the cathode 116 is not arranged around the gate 118 but is arranged under the second n-doped semiconductor portion 108, directly in contact with it;

the active zone 104 of the simulated LED is formed by a single InGaN quantum well comprising 16% of indium and is made in a non-intentionally doped GaN layer (similar results to those described below would however be obtained if the active zone 104 were formed by different elements);

the p-doped 106 and n-doped 108 semiconductor portions, the active zone 104, and the electrodes 112 and 116 are made as a cylindrical mesa structure having a diameter equal to 1 µm;

the gate 118 is not made throughout the height of the junction of the LED but is only formed around the p-doped semiconductor portion 106, and is separated from this p-doped semiconductor portion 106 by an SiO$_2$ dielectric passivation layer 120 having a thickness equal to 5 nm.

The curve 10 depicts the internal quantum efficiency obtained in such a LED when Vg=0 V. The curve 12 depicts the internal quantum efficiency obtained in such a LED when Vg=–10 V. By way of comparison, the curve 14 depicts the internal quantum efficiency obtained in a similar LED but which does not comprise a gate formed around the junction of the LED. Moreover, the curve 16 depicts the internal quantum efficiency obtained in such a LED when Vg=10 V.

By applying a voltage Vg=–10 V, the internal quantum efficiency in the active zone 104 is greatly emphasized: it goes from about 20% when Vg=0 V to a maximum of more than 80%. By contrast, when a positive voltage Vg is applied, the internal quantum efficiency becomes nearly zero due to a particular band curvature at the interface, making ionization of acceptors even more difficult.

These curves are good illustrations of the increased internal quantum efficiency obtained by applying a negative voltage Vg between the gate 118 and the anode 112 of the LED 100. This increased internal quantum efficiency of the LED is also obtained when the electric potential applied to the gate 118 is zero with respect to a similar LED which does not comprise a gate. This is due to the fact that when a voltage is applied between the anode 112 and the cathode 116 of the LED, by maintaining the cathode at 0 V and by applying a positive voltage to the anode 112 to circulate a current, there is then a potential difference between the p-doped semiconductor of the junction and the gate 118. This makes a field effect promoting the acceptor ionization in the p-doped semiconductor.

Figure 4:
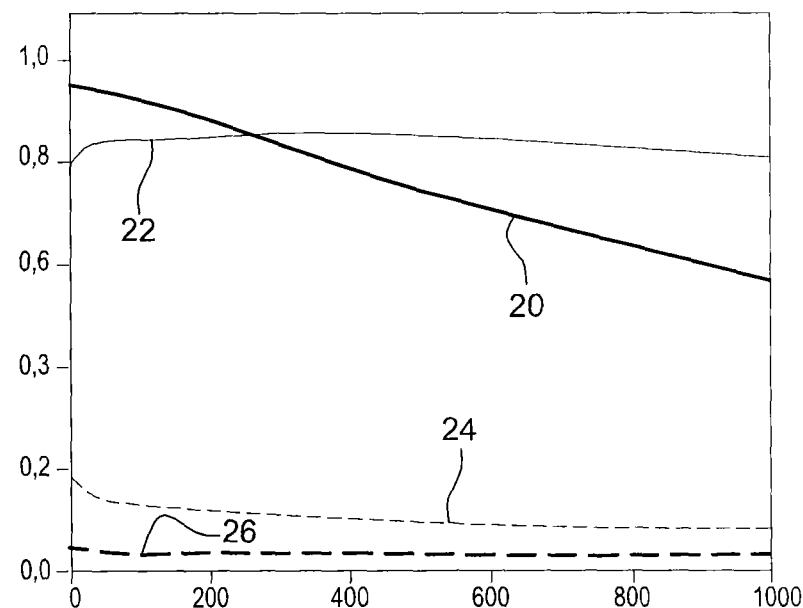

FIG. 4 depicts the internal quantum efficiency obtained in a mesa structure LED and comprising a gate 118 surrounding the p-doped semiconductor portion 106, as a function of the current density, in A/cm$^2$, in the LED for different potential difference values between the gate 118 and the anode 112. With respect to the LED used for the previous simulation the obtained internal quantum efficiency of which is depicted in FIG. 3, the LED used herein comprises a gate 118 arranged around all the junction, throughout the height of the junction, that is around n-doped 108 and p-doped 106 semiconductor portions, and around the active zone 104.

The curve 20 depicts the internal quantum efficiency obtained in such a LED when Vg=0 V. The curve 22 depicts the internal quantum efficiency obtained in such a LED when Vg=–10 V. The curve 24 depicts the internal quantum efficiency obtained in a similar LED but which does not comprise a gate formed around the junction of the LED. The curve 26 depicts the internal quantum efficiency obtained in such a LED when Vg=10 V.

As previously, the internal quantum efficiency is greatly emphasized when a negative or zero voltage Vg is applied, that is when the potential difference between the gate and the anode is zero or negative. It can also be seen in this figure that for a LED the gate of which surrounds the junction throughout the height of the junction, for small current densities, for example lower than about 250 A/cm$^2$, it is even more interesting to work with a zero voltage Vg. This is due to the fact that in this geometry, the gate has also an effect on the donor ionization in the n-doped semiconductor of the LED. For a zero gate voltage, the field effect is low on the n side and does almost not limit the donor ionization. By contrast, due to the potential difference between the anode and the cathode (about 3.5 V), an already substantial field effect exists on the p side. The potential difference between the p-doped semiconductor and the gate enables the acceptors to be ionized on the surface of the p-doped semiconductor.

For stronger current densities, for example higher than about 400 A/cm$^2$, what limits the internal quantum efficiency in the case where a 0 V voltage Vg is applied is the limited quantity of ionized acceptors. In this case it is preferable to use a negative voltage Vg, for example equal to about –10 V.

Figure 5:
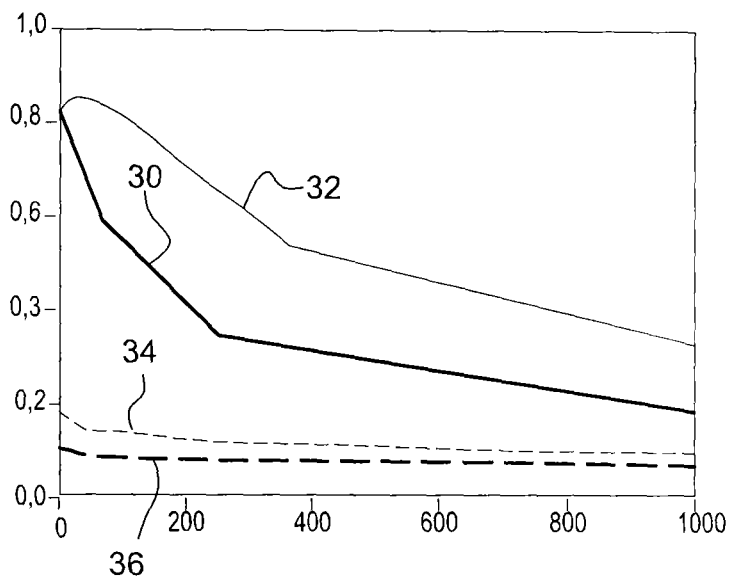
Figure 6:
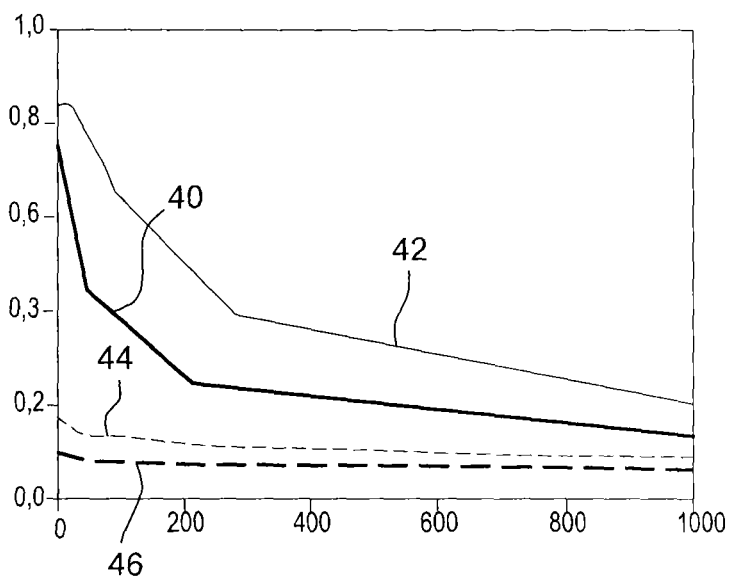

FIGS. 5 and 6 depict the internal quantum efficiency obtained in a mesa structure LED comprising a gate surrounding the p-doped semiconductor portion, as a function of the current density, in A/cm$^2$, in the LED for different values of potential difference between the gate and the anode. With respect to the LED used for the previous simulation, the internal quantum efficiency obtained of which is depicted in FIG. 4, the diameter of the mesa structure of the LED the internal quantum efficiency of which is depicted in FIG. 5 is equal to 5 µm, and equal to 10 µm for FIG. 6.

Curves 30 and 40 depict the internal quantum efficiency obtained in these LEDs when Vg=0 V. Curves 32 and 42 depict the internal quantum efficiency obtained in these LEDs when Vg=–10 V. Curves 34 and 44 depict the internal quantum efficiency obtained in LEDs which are similar but which do not comprise a gate formed around the junctions of the LEDs. Curves 36 and 46 depict internal quantum efficiency obtained in these LEDs when Vg=10 V.

FIGS. 4 to 6 illustrate the fact that the electric field effect made by the gate can be seen up to mesa diameters of 10 μm. Furthermore, this effect is noticeable up to mesa structure diameters of about 50 μm. FIGS. 5 and 6 also show that the effect remains interesting for lower current densities when the size of the mesa structure of the LED increases: in the case of a mesa structure having a diameter of 5 μm, the internal quantum efficiency drops to about 30% for a current density of 1 000 A/cm$^2$ and a voltage Vg of −10 V, whereas for a mesa structure having a diameter of 10 μm, the internal quantum efficiency is about 20% for a current density of 1 000 A/cm$^2$ and it is about 40% for current density of 300 A/cm$^2$.

This field effect made by the gate arranged around a p-n or p-i-n junction is also very interesting in the case of p-n or p-i-n junctions made with materials having greater gaps than the one of GaN, such as AlGaN. In such materials, the acceptor ionization energy is even higher than in GaN. Thus, in AlGaN, with about 40% of aluminium, the acceptor ionization energy is of about 300 meV. For AlN, the acceptor ionization energy is in the order of 600 meV. For Aln with about 70% of aluminium, the acceptor ionization energy is in the order of 450 meV. The use of barrier layers with about 70% of aluminium enables AlGaN quantum wells to be made with about 45% of aluminium and a light emission to be obtained from these quantum wells at about 4.7 eV, mainly at wavelengths of about 260 nm that are in the UV range. This emission wavelength is very interesting since it is adapted to disinfect water because this wavelength of 260 nm kills bacteria in water.

Figure 7:
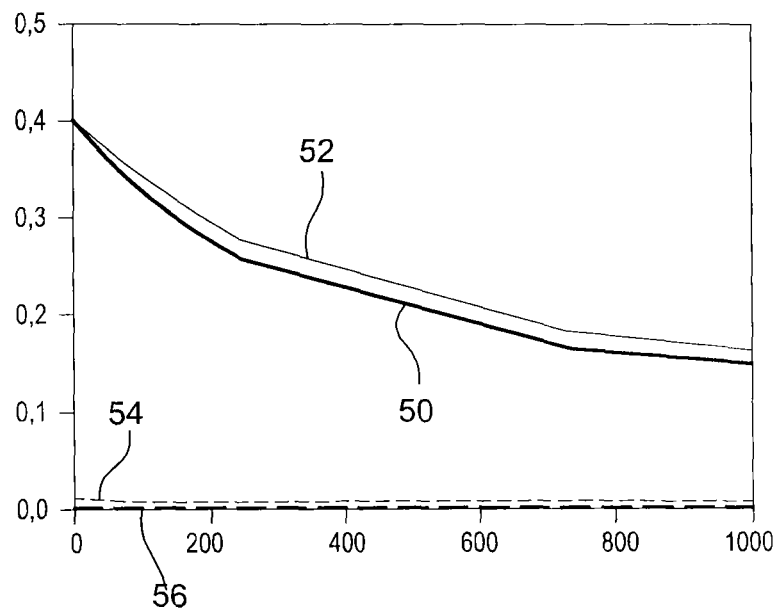
Figure 8:
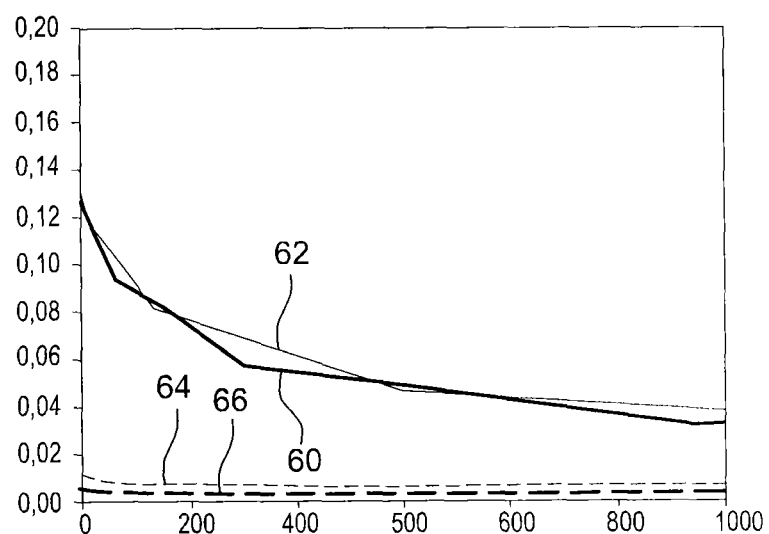
Figure 9:
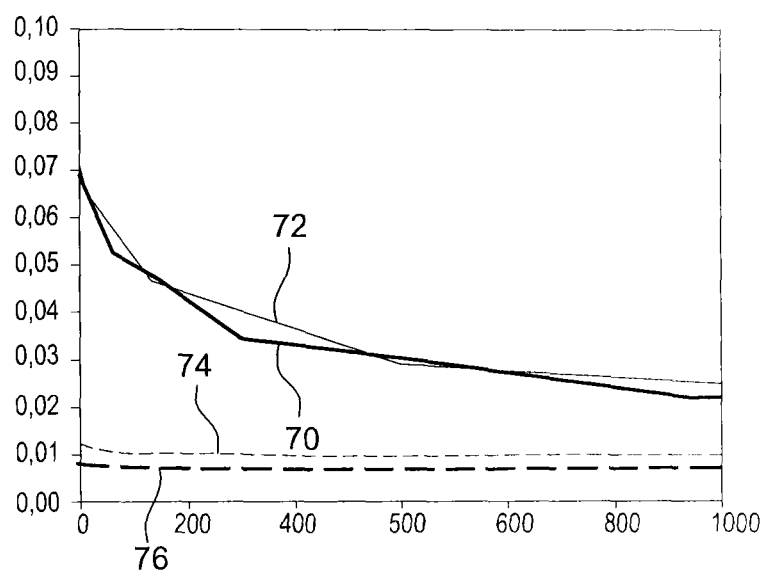

FIGS. 7 to 9 depict the internal quantum efficiency obtained in a mesa structure LED emitting at a wavelength of about 260 nm. As in the previous simulations, the simulated LED does not comprise the parts 114 and the cathode 116 is not arranged around the gate 118 but is arranged under the second n-doped semiconductor portion 108, directly in contact with it. The p- and n-doped semiconductor portions 106 and 108 comprise $Al_{0.7}Ga_{0.3}N$ with a concentration equal to $10^{17}$ acceptors/cm$^3$ for the p-doped portion 106 and a concentration equal to $10^{18}$ donors/cm$^3$ for the n doped portion 108. The active zone 104 of the simulated LED comprises a single $Al_{0.4}Ga_{0.6}N$ quantum well made in a non-intentionally doped $Al_{0.7}G_{0.3}N$ layer having a residual donor concentration $n_{id}$ equal to about $10^{17}$ donors/cm$^3$, forming the barrier layers of the active zone 104. The p- and n-doped semiconductor portions 106 and 108, the active zone 104 and the electrodes 112 and 116 are made as a cylindrical mesa structure having a diameter equal to 1 μm for FIG. 7, to 5 μm for FIG. 8 and to 10 μm for FIG. 9. Furthermore, the gate 118 is made throughout the height of the junction of the LED, around the p- and n-doped semiconductor portions 106 and 108, and around the active zone 104.

Curves 50, 60, and 70 depict the internal quantum efficiency obtained in these LEDs when Vg=0 V. Curves 52, 62, and 72 depict the internal quantum efficiency obtained in these LEDs when Vg=−10 V. Curves 54, 64, and 74 depict the internal quantum efficiency obtained in LEDs which are similar but which do not comprise a gate formed around the junction of the LEDs. Curves 56, 66, and 76 depict the internal quantum efficiency obtained in these LEDs when Vg=10 V.

As previously, the curves depicted in FIGS. 7 to 9 show that the internal quantum efficiency of such a LED can be greatly increased by using a gate 118 around the junction. This would also be the case as long as the gate 118 is arranged facing at least one part of the p-doped semiconductor portion 106, at the interface with the active zone 104.

The gate 118 also enables the detrimental effects of a possible too strong $n_{id}$ doping in the active zone 104 or of a possible too low doping in the p-doped semiconductor portion 106 to be compensated.

The effect of the gate around the p-doped semiconductor is beneficial whatever the structure of the active zone: with or without an electron blocking layer, and whatever the number of quantum wells. In the case of a LED comprising a p-type AlGaN electron blocking layer arranged between the p-doped semiconductor portion 106 and the active zone 104, it is also beneficial to form the gate 118 around the electron blocking layer.

The presence of this gate also enables good internal quantum efficiencies without using an electron blocking layer in the LED.

In the exemplary embodiment previously described in relation to FIG. 1, the gate 118 is made around the first electrode 112, the first p-doped semiconducting material portion 106, the active zone 104, and part of the height (dimension along the axis Z) of the second n-doped semiconducting material portion 108. Alternatively, the gate 118 can be made throughout the height of the junction of the LED 100, that is at the overall height of the second n-doped semiconducting material portion 108. According to other alternatives, the gate 118 can be made:

only around the first electrode 112, the first p-doped semiconductor portion 106 and the active zone 104, or only around the first electrode 112, the first p-doped semiconductor portion 106 and part of the active zone 104, or even only around the first electrode 112 and the first p-doped semiconductor portion 106, or only around the first p-doped semiconductor portion 106 (with in this case a material filling the space between the apex of the gate 118 and the upper face 122 which is substantially planar), or only around part of the first p-doped semiconductor portion 106 which is located at the junction, that is in contact with the active zone 104 (with in this case a material filling the space between the apex of the gate 118 and the upper face 122 which is substantially planar).

Furthermore, it is possible for the gate 118 to only partially surround the previously mentioned elements of the mesa structure 124. The gate 118 can be arranged at one or more sides of the mesa structure 124 of the LED 100.

An electron blocking layer, for example of AlGaN with an aluminium concentration between 8% and 15% and p-doped can further be arranged between the active zone 104 and the first p-doped semiconductor portion 106.

According to an alternative, the mesa structure 124 of the LED 100 can comprise no active zone 104, and the first p-doped semiconductor portion 106 is then directly arranged on the second n-doped semiconductor portion 108. The space charge zone is then in part of each one of the portions 106, 108 which are one against the other.

The mesa structure 124 of the LED 100 can form a pad having a section of any shape, or an elongated shaped portion (rectilinear or curved), or even a portion of any other shape as long as this shape of the mesa structure 124 enables a light-emitting diode to be formed.

As an alternative to SiN used to make the dielectric passivation layer 120, this dielectric passivation layer 120 can comprise a High-k-type dielectric material such as $HfO_2$ or $ZrO_2$, which enables a more significant electric field to be obtained in the mesa structure 124 than in the case of a dielectric passivation layer 120 formed with a dielectric material having a lower electrical permittivity such as SiN.

The SiN dielectric passivation layer 120 can advantageously have a thickness at least equal to 50 nm to avoid a breakdown when the potential difference between the gate and the anode can reach about 15 V. Preferably, the thickness of the dielectric passivation layer 120 is selected such that it can withstand a potential difference of about 20 V without a breakdown, this thickness being a function of the material used to make the dielectric passivation layer 120.

Several LEDs similar to the LED 100 can be made next to each other on the substrate 102. Moreover, the second n-doped semiconductor layer can form a common base for all the LEDs and form all the second portions 108 of these LEDs. The second electrodes 116 of these LEDs can in this case form a common electrode, for example a common cathode, for all the LEDs, the individual addressing of the LEDs being made through the first electrode 112 specific to each LED.

Although it is preferable to fix the electric potential of the gate of each LED in order to control the dopant ionization effect, the potential may not be fixed and be let floating, and only the potentials applied to the electrodes may be fixed.

Figure 10:
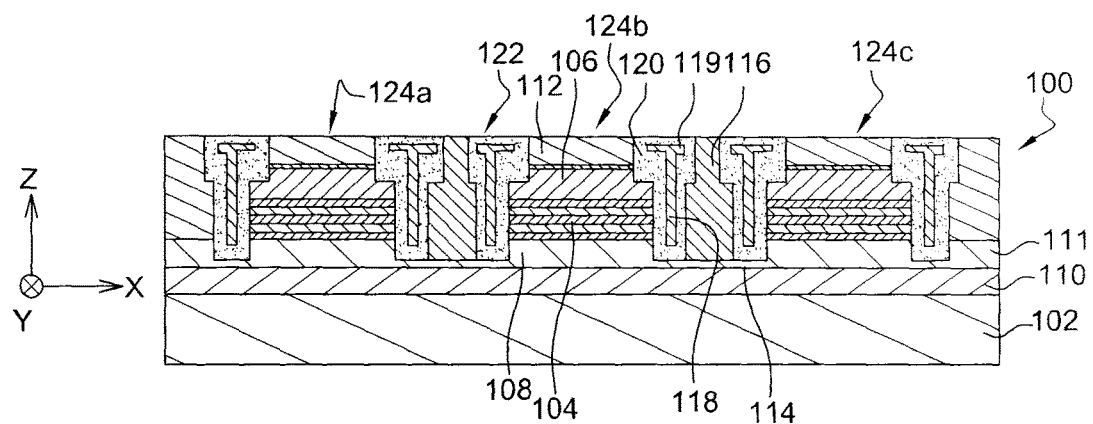
FIGS. 10 and 11 schematically depict an optoelectronic device according to a second embodiment.
Figure 11:
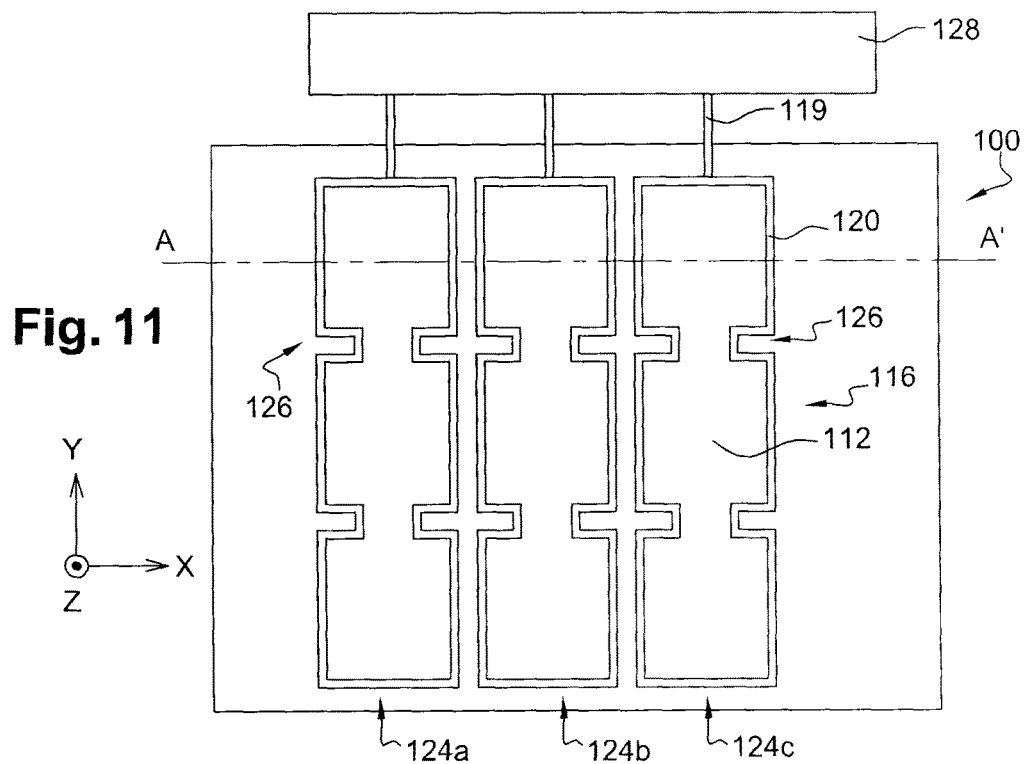

FIGS. 10 and 11 respectively depict a schematic cross-section view (along the axis AA' depicted in FIG. 11) and a schematic top view of an optoelectronic device 100 according to a second embodiment, here a LED, comprising several regions forming mesa structures 124a, 124b, and 124c arranged next to each other. The mesa structures 124a, 124b, and 124c of the LED 100 according to this second embodiment are formed by the same layers of materials as those forming the mesa structure 124 of the LED 100 according to the first embodiment.

The mesa structures 124a, 124b, and 124c of the LED 100 schematically form several longilineal portions (three in the exemplary embodiment depicted in FIGS. 10 and 11) arranged parallel next to each other, and each surrounded by a gate 118. Moreover, the profile of each of these portions is here not totally rectilinear and comprises "depressions", or hollows, 126 enabling the contact surface of the gates 118 with the mesa structures 124a, 124b, and 124c to be increased. Furthermore, in this second embodiment, the upper surfaces of the gates 118 which form part of the planar upper surface 122 in the first embodiment are here overlaid by electrical contacts 119 in turn overlaid by parts of the dielectric passivation layers 120 which therefore totally surround the gates 118 and the electrical contacts 119. The gates 118 can be electrically accessed via an electrical contact 128 offset or remote with respect to the other elements of the LED 100 and to which the gates 118 of the LED 100 are connected through the electrical contacts 119.

As in the first embodiment, the second n-doped semiconductor layer 111 forms the n-doped portions 108 and the parts 114 on which the second electrodes 116 forming here the cathodes, rest. The second electrodes 116 are electrically connected to the second n-doped portions 108 via the parts 114 of this second n-doped semiconductor layer 111. Moreover, the LED 100 according to the second embodiment comprises the upper surface 122 which is substantially planar and formed by the upper faces of the electrodes 112 and 116 as well as by the upper faces of the dielectric passivation layers 120 (which overlay the gates 118 and the electrical contacts 119).

The electrodes 112 and 116 can for example be formed by superimposing several electrically conductive materials.

The mesa structures 124a, 124b, and 124c can have any other shape than those depicted in the example of FIGS. 10 and 11.

Furthermore, the different alternatives and details previously described for the first embodiment (related to the used materials, the elements of the mesa structure surrounded by the gate, the gate totally surrounding or not the mesa structure, etc.) can also apply to the second embodiment.

Figure 12:
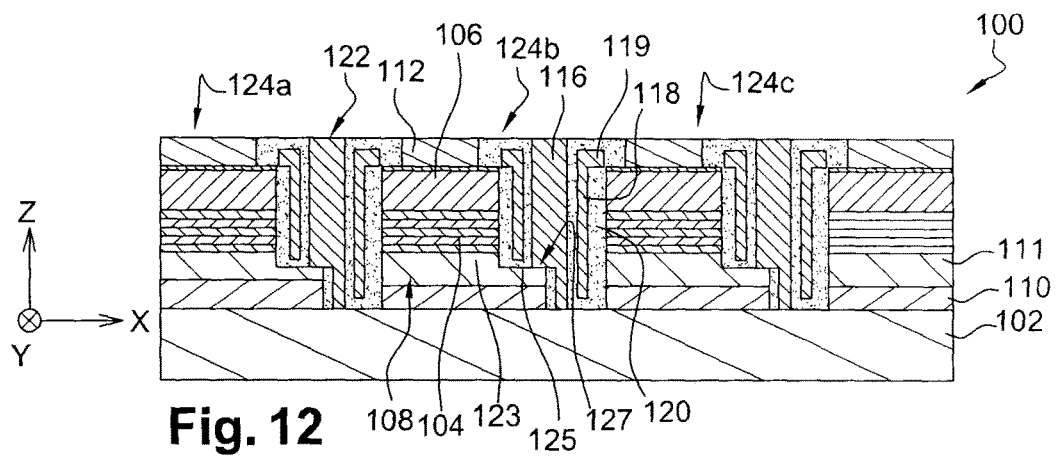
FIG. 12 schematically depicts an optoelectronic device according to an alternative second embodiment.

FIG. 12 depicts a side cross-section view of an optoelectronic device 100 according to an alternative of the previously described second embodiment.

In this alternative, a first part 123 of the second semiconductor portion 108 arranged between a second part 125 of the second semiconductor portion 108 and the active zone 104 forms a recess, or an indentation, with respect to the second part 125 of the second semiconductor portion 108. A first part of each of the second electrodes 116 penetrates throughout the second n-doped semiconductor layer 111 as well as the buffer layer 110 and directly rests on the substrate 102. A second part of each of the second electrodes 116 adjacent to the first part rests on an upper face 127 of the second part 125 of the second semiconductor portion 108, and is electrically connected to the second portion 108 of the mesa structure adjacent at this upper face 127. Each of the mesa structures 124a, 124b, and 124c is surrounded by the gate 118 which extends on a side (which does not comprise the recess) throughout the height of the mesa structure and on the other (which comprises the recess) on only part of the height of the mesa structure. The part of the gate 118 which lies at the recess rests on the upper face 127. A part of the dielectric passivation layer 120 is interposed between the gate 118 and the upper face 127.

The advantage of this alternative is to enable a series interconnection of the optoelectronic devices by connecting, for each interconnected device, the second electrode 116 to the first electrode 112 of the adjacent device.

This alternative second embodiment can also apply to the previously described first embodiment.

Figure 13:
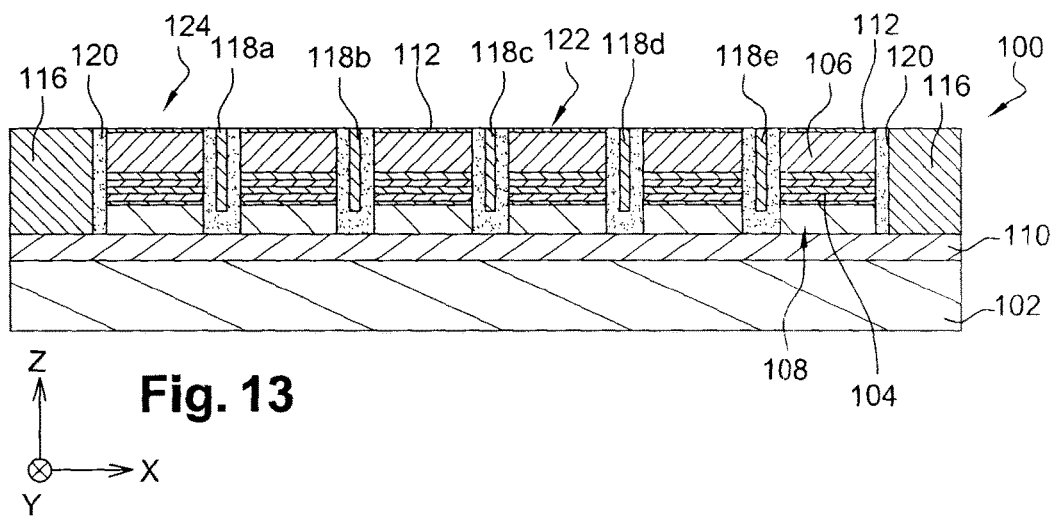
FIGS. 13 and 14 schematically depict an optoelectronic device according to a third embodiment.
Figure 14:
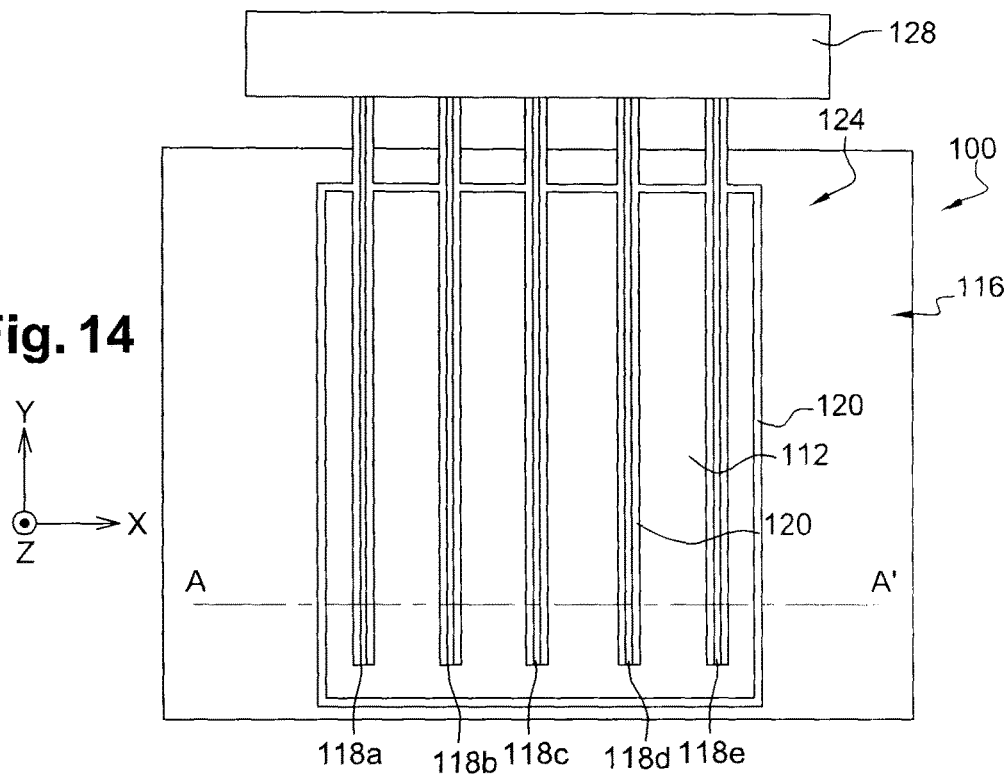

FIGS. 13 and 14 respectively depict a schematic cross-section view (along the axis AA' depicted in FIG. 14) and a schematic top view of an optoelectronic device 100, here a LED, according to a third embodiment.

The DEL 100 comprises a single mesa structure 124 which, in the example of FIGS. 13 and 14, has a substantially rectangular shape section, in the plane (X, Y), and is formed by the same layers of materials as those forming the mesa structure 124 of the LED 100 according to the first embodiment.

In this third embodiment, the mesa structure 124 is not surrounded by the gate 118 but is penetrated by several electrically conductive material portions 118a-118e (5 portions in the example of FIGS. 13 and 14) extending in the mesa structure 124 and forming together the gate 118. In the example described here, the portions 118a-118e correspond to rectilinear shaped portions extending in a direction parallel to the substantially plane surface 122 (parallel to the axis Y in FIG. 14). Each of the electrically conductive material portions 118a-118e is surrounded, at the side flanks and the lower face of these portions, by the dielectric passivation layer 120 providing the electrical insulation between the portions 118a-118e and the materials of the mesa structure 124. In this third embodiment, the dielectric passivation layer 120 advantageously comprises a High-k-type dielectric material such as $HfO_2$ or $ZrO_2$, but could also comprise a lower permittivity dielectric material. The electrically conductive metallic portions 118a-118e are electrically connected to the electrical contact 128 which is offset with respect to the other elements of the LED 100.

The second electrode 116 is formed by an electrically conductive material portion surrounding the mesa structure 124, as in the first embodiment, and in contact with the buffer layer 110 which provides the electrical connection between the second electrode 116 and the second n-doped semiconductor portion 108. Parts of the dielectric passivation layer 120 also overlay the outer side flanks of the mesa structure 124 and thus electrically insulate the other elements of the mesa structure 124 (first electrode 112, first p-doped semiconductor portion 106, active zone 104) from the second electrode 116.

With such a structure, the internal quantum efficiency of the LED 100 is improved thanks to the presence of the gate 118 in the mesa structure 124 which enables an electric field to be generated in a way similar to the previous embodiments in which the gate(s) 118 surround(s) the mesa structure(s). The electrically conductive material portions 118a-118e forming the gate 118 can have a shape, rectilinear or not, different from the one of the example of FIGS. 13 and 14, and/or the gate 118 can have a different number of electrically conductive material portions forming the gate 118, particularly according to the dimensions of the mesa structure 124 of the LED 100.

The previously described characteristics for the first embodiment in relation to the diameter of the mesa structure as a function of the materials used similarly apply to the distances between the electrically conductive material portions 118a-118e forming the gate 118, as a function of the materials forming the mesa structure 124 of this LED 100. The different alternatives and details previously described for both previous embodiments can also apply to this third embodiment.

Figure 15:
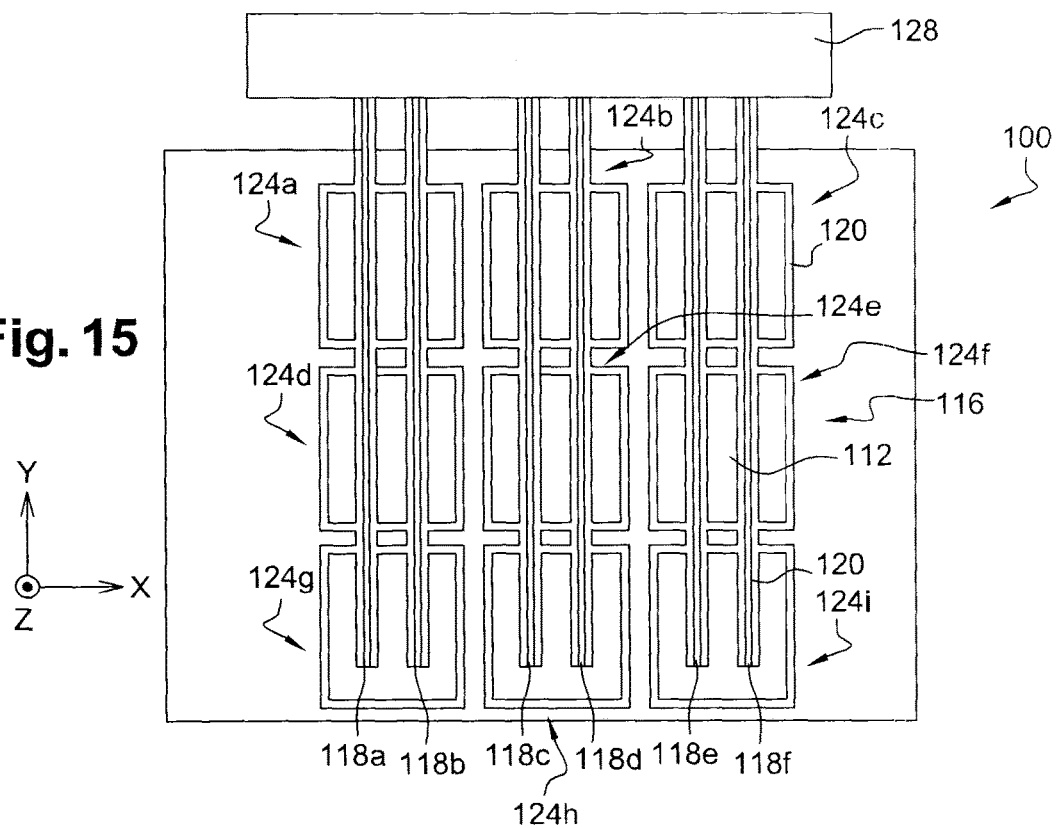
FIG. 15 schematically depicts an optoelectronic device according to an alternative third embodiment.

FIG. 15 depicts a top view of an optoelectronic device 100 according to an alternative of the third embodiment.

According to this alternative, the mesa structure 124 is formed by several pads, or islands, arranged next to each other, having a cylindrical, parallelepiped, or other shape. In the example of FIG. 15, nine pads 124a-124i are arranged forming a 3×3 matrix. The gate 118 is formed by electrically conductive material portions 118a-118f (six in the example of FIG. 15) extending through the pads 124a-124i. Each pad 124a-124i is penetrated by two of the portions 118a-118f in the example of FIG. 15, but could be alternatively penetrated by a different number of electrically conductive material portions forming the gate 118. Each pad 124a-124i is surrounded by part of a dielectric passivation layer 120 enabling the second electrode 116 which surrounds each pad 124a-124i to be electrically insulated.

The number and/or the shape of the pads forming the mesa structure 124, as well as the number and/or the shape of the electrically conductive material portions forming the gate 118 can be different from those of the example of FIG. 15.

In all the embodiments, the gate 118 is advantageously made as "dense" as possible with respect to the mesa structure(s) 124, that is such that the contact surface between the gate 118 and the mesa structure(s) 124 is as large as possible.

FIGS. 16A to 16L schematically depict the steps of a method for making the optoelectronic device 100, here a LED, according to the second embodiment. These figures depict side cross-section views of the structure forming the optoelectronic device 100.

Figure 16A:
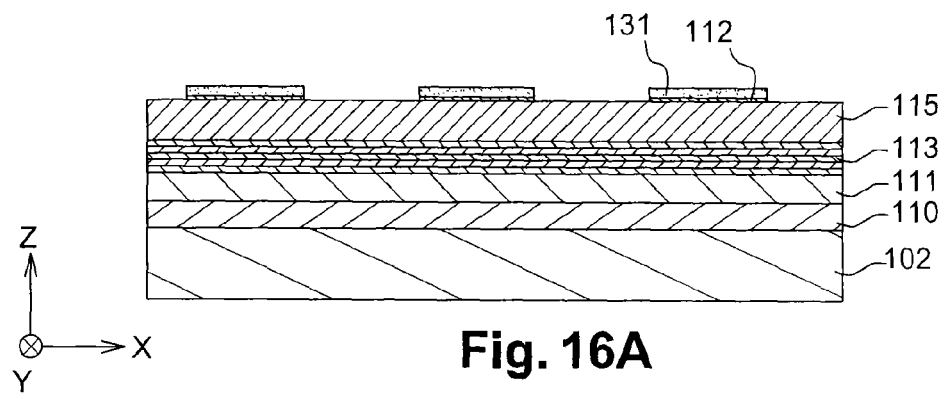
FIGS. 16A to 16L schematically depict the steps of a method for making an optoelectronic device according to the second embodiment.

As depicted in FIG. 16A, on the substrate 102, the layer stack is first made, from which the mesa structures 124 of the LED 100 will be made. This stack comprises, in the direction from the upper face of the stack to the lower face of the stack in contact with the substrate 102, a first p-doped semiconductor layer 115 (herein comprising GaN), active layers 113 corresponding to an alternate stack of one or more quantum well emissive layers, comprising for example InGaN, and of barrier layers, comprising for example GaN, a second n-doped semiconductor layer 111, comprising for example GaN, and the buffer layer 110 comprising for example n-doped GaN.

The first electrodes 112 intended to form the anodes of the LED 100 are then made on the first p-doped semiconductor layer 115, for example through depositing, then lithographing, and etching a first electrically conductive material layer, comprising for example aluminium. The first electrodes 112 each have a shape and dimensions, in the plane of the upper face of the first p-doped semiconductor layer 115 on which they are made, substantially similar to those desired for the mesa structures 124 of the LED 100, and for example a disk-shaped section. A hard mask 131 is made on the first electrically conductive material layer intended to form the first electrodes 112 such that apertures formed in this mask 131 correspond to the patterns to be etched in the layer stack on which the hard mask 131 is formed in order to define the first electrodes 112 and the mesa structures 124 of the LED 100. In the embodiment described here, the hard mask 131 portions have a shape and dimensions, in the plane of the upper face of the first p-doped semiconductor layer 115 on which the first electrodes 112 are made, substantially similar to those of the first electrodes 112.

Figure 16B:
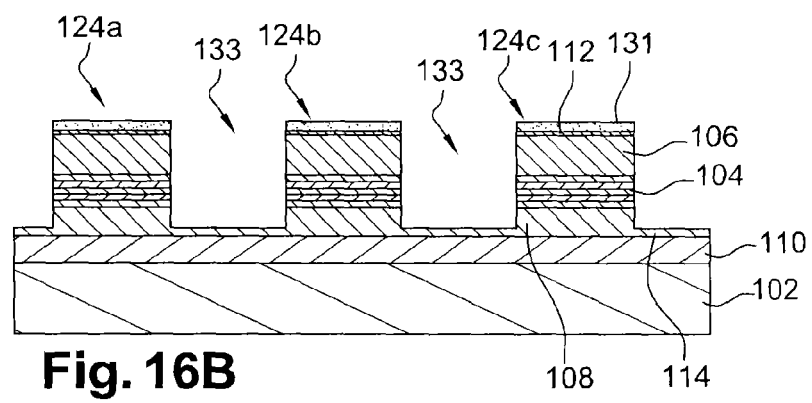

As depicted in FIG. 16B, an etching of the first p-doped semiconductor layer 115, the active layers 113 and part of the thickness of the second n-doped semiconductor layer 111 is also implemented according to the pattern defined by the hard mask 131, forming the mesa structures 124a, 124b, and 124c, having for example a cylindrical shape, each comprising the active zone 104 arranged between the first p-doped semiconductor portion 106 and the second n-doped semiconductor portion 108. This etching is stopped at a depth level located in the second n-doped semiconductor layer 111 such that a portion 114 of this second layer 111 is kept at the bottom of each etched zone of the stack (on which the second electrodes 116 will rest). This etching step forms, around the mesa structures 124, empty spaces 133 which will later be used for making the second electrodes 116, the dielectric passivation layer 120, and the gates 118. The implemented etching is a dry etching, for example a reactive-ion etching with a $Cl_2$ plasma. This etching delimits the mesa structures 124.

The hard mask 131 can be suppressed or not before implementing the following steps. Moreover, etching the electrodes 112 and etching the mesa structures 124 are preferably implemented during a same etching step.

Figure 16C:
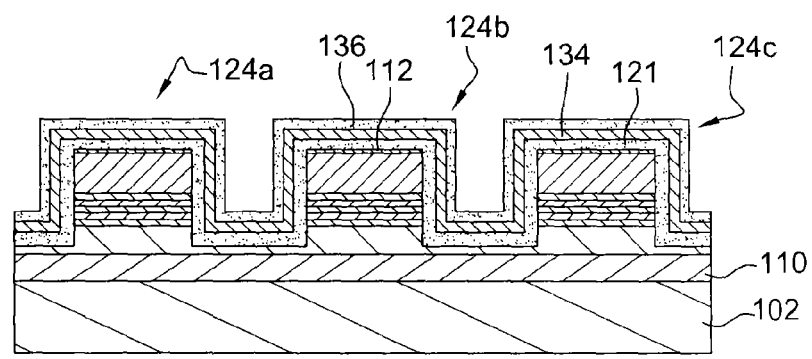

A first dielectric layer 121, for example comprising SiN or a High-K dielectric material according to the material wanted to form the dielectric passivation layer 120, is then deposited with a standard thickness, for example equal to 10 nm, on the hard mask 131 portions and along the walls of the empty spaces 133, thus overlaying the sidewalls of the first electrodes 112, the first p-doped semiconductor portions 106, the active zones 104 and the second n-doped semiconductor portions 108. This first dielectric layer 121 is also deposited on the non-etched parts 114 of the second n-doped semiconductor layer 111 forming the bottom walls of the empty spaces 133. A second electrically conductive material layer 134 intended to form the gates 118, for example of aluminium and having a thickness equal to about 500 nm, is then deposited in a standard way on the first dielectric layer 121. A second dielectric layer 136, comprising for example SiN or a High-k dielectric material having a thickness equal to 100 nm, or more generally at least equal to 5 nm, is then deposited on the second electrically conductive material layer 134 (FIG. 16C).

Figure 16D:
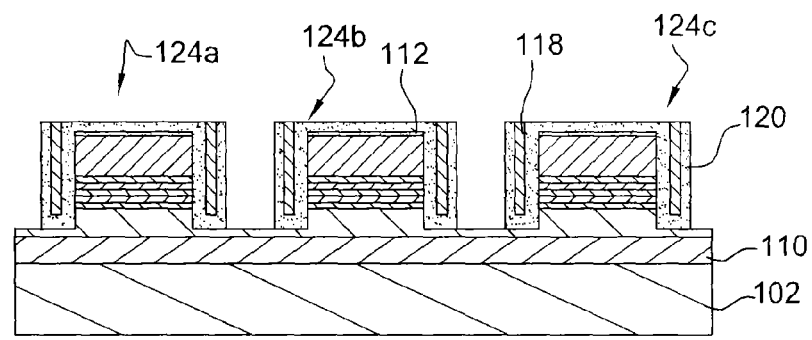

A directive etching of the second dielectric layer 136, via an $SF_6$ plasma, and of the second electrically conductive material layer 134, via a $Cl_2$ argon-type plasma, is then implemented such that remaining portions of the second dielectric layer 136 and of the second electrically conductive material 134 overlay the sidewalls of the empty spaces 133, that is the side flanks of the mesa structures 124 (FIG. 16D). The remaining portions of the second electrically conductive material layer 134 form the gates 118 surrounding the mesa structures 124, and the remaining portions of the dielectric layers 121 and 136 form parts of the dielectric passivation layer 120.

Advantageously, the dielectric layer 121 and the electrically conductive material layer 134 are etched before depositing the second dielectric layer 136. The second dielectric layer 136 is then deposited, which enables the lower parts of the remaining portions of the conductive layer 134 to be properly surrounded by dielectric, as depicted in FIG. 16D. Another etching can then be implemented to form the access points to the second n-doped semiconductor layer 111 between the mesa structures 124.

Figure 16E:
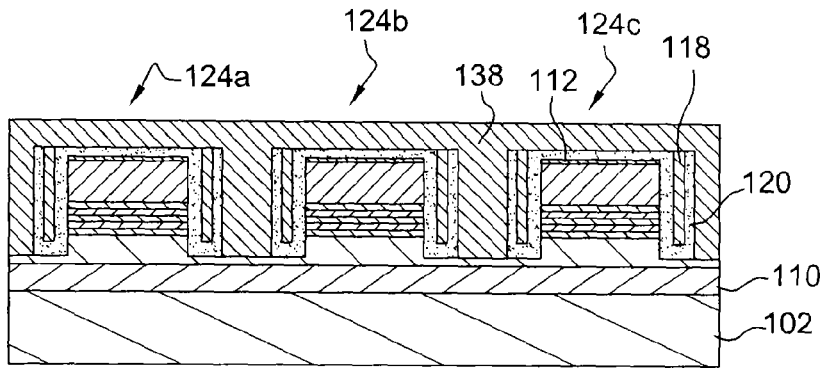

A deposition of a third electrically conductive material layer 138 is then made in order to fill the empty spaces 133 (FIG. 16E). This deposition is made on the whole structure and also overlays the mesa structures 124. This deposition is for example obtained via a deposition of a titanium layer having a thickness equal to about 20 nm, then a deposition of an aluminium layer having a thickness equal to about 1 μm.

Figure 16F:
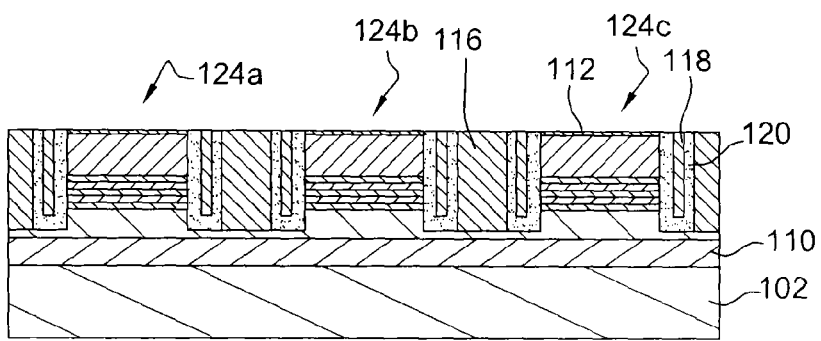

As depicted in FIG. 16F, a chemical-mechanical planarization (CMP) is then implemented in order to suppress the parts of the third layer 138 overlaying the mesa structures 124 and also suppress the parts of the passivation layer 120 overlaying the mesa structures 124. This CMP is implemented by taking as the stop surface the upper faces of the first electrodes 112. The remaining portions of the layer 138 form the second electrodes 116.

Figure 16G:
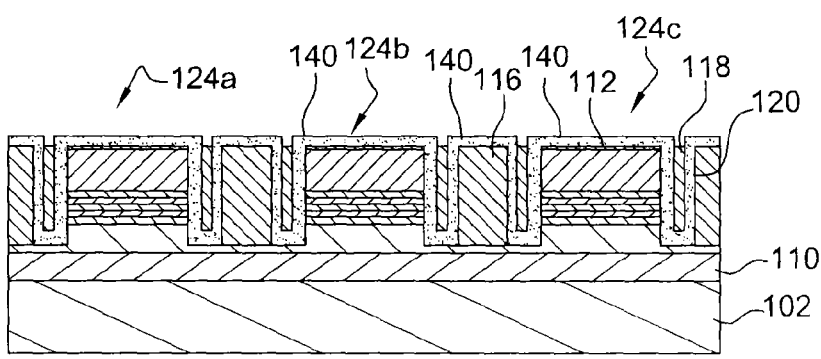
Figure 16H:
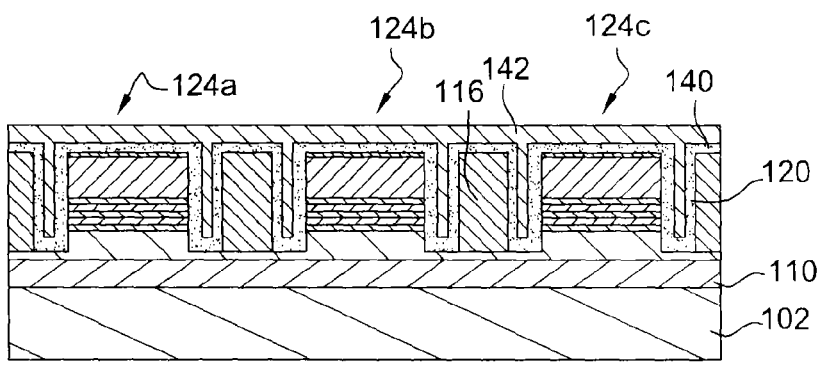

A deposition of a third dielectric layer 140, comprising for example SiN or a High-k dielectric, and having a thickness equal to about 100 nm, is then made, this third dielectric layer 100 being then etched so that the remaining portions of this third dielectric layer 140 do not overlay the gates 118 (FIG. 16G).

A deposition of a fourth electrically conductive material layer 142 is then made on the whole structure (FIG. 16H) in order to make, after etching, the electrical contacts 119 on the gates 118 as well as the electrical contact 128 offset with respect to the mesa structures 124 and to which the gates 118 are connected via the electrical contacts 119. This electrically conductive material corresponds for example to aluminium deposited on a thickness of about 100 nm.

Figure 16I:
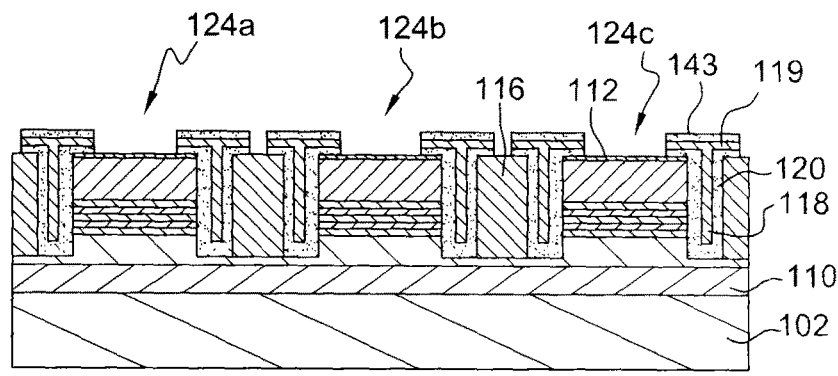
Figure 16J:
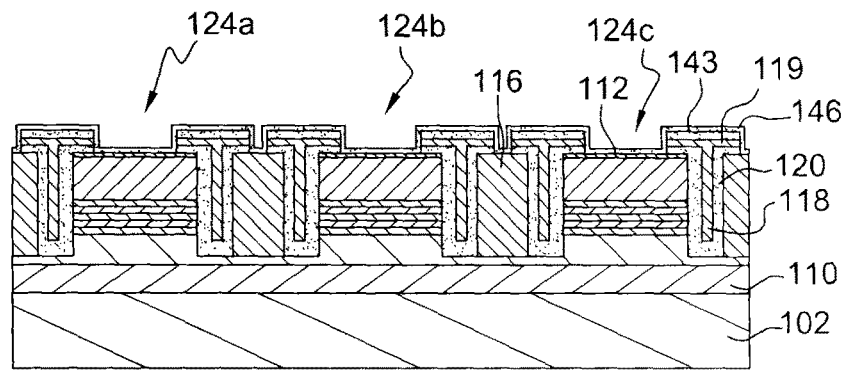

As depicted in FIG. 16I, a fourth dielectric layer 143 (SiN or High-k dielectric) is deposited on the fourth electrically conductive material layer 142, then this fourth dielectric layer 143 and the fourth electrically conductive material layer 142 are etched so that remaining portions of the fourth electrically conductive material layer 142 form the electrical contacts 119 arranged on the gates 118 and electrically connect the gates 118 to the offset contact 128, and remaining portions of the fourth dielectric layer 143, being part of the dielectric passivation layer 120, overlay the electrical contacts 119. Parts of the third dielectric layer 140 overlaying the electrodes 112 and 116 are also etched in order to form access points to the electrodes 112 and 116.

Figure 16K:
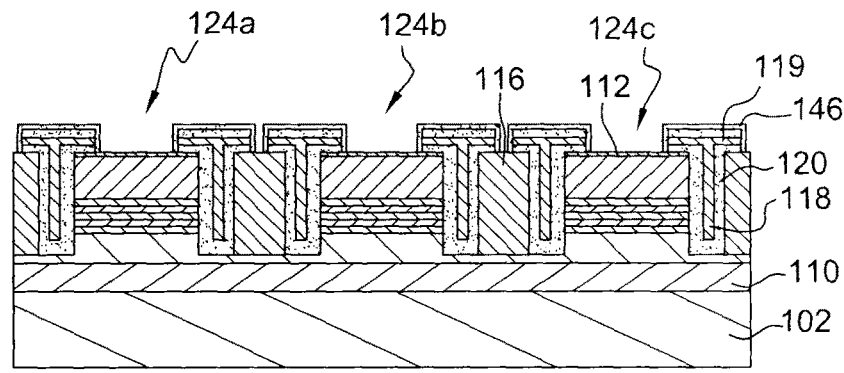

A fifth dielectric material layer 146 (SiN or High-k dielectric) is deposited on the whole structure, for example with a thickness equal to about 100 nm (FIG. 16J), then the parts of this fifth dielectric layer 146 overlaying the electrodes 112 and 116 are etched in order to form access points to the electrodes 112 and 116 (FIG. 16K). Remaining portions of this fifth dielectric material layer 146 overlay the side flanks of the electrical contacts 119 and form, with the remaining portions of the other dielectric layers, the dielectric passivation layers 120 surrounding the gates 118 and the electrical contacts 119.

Figure 16L:
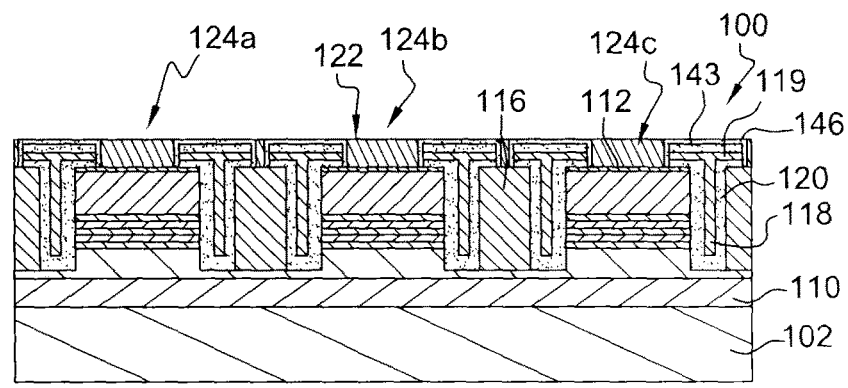

The LED 100 is completed by depositing a fifth electrically conductive material layer on the whole structure and by implementing a CMP with a stop on the dielectric passivation layers 120, thus forming metallic portions extending the electrodes 112 and 116 to a same level as the dielectric passivation layers 120 (FIG. 16L). This last CMP step can form, at the substantially planar upper face 122, slight depressions at the metallic contacts with respect to the dielectric passivation layers 120.

FIGS. 17A to 17F depict the steps of a method for making an optoelectronic device 100, here a LED, according to the third previously described embodiment. These figures depict side cross-section views of the structure intended to form the LED 100.

Figure 17A:
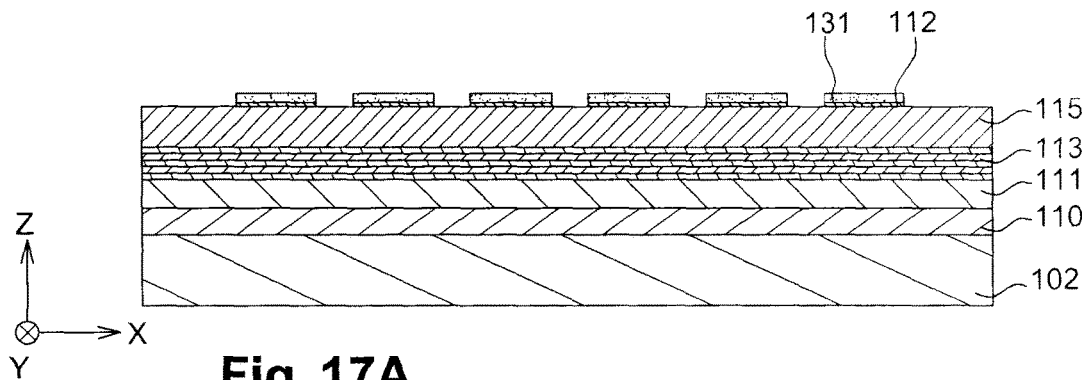
FIGS. 17A to 17F schematically depict the steps of a method for making an optoelectronic device according to the third embodiment.

As depicted in FIG. 17A, on the substrate 102, the layer stack is first made, from which the mesa structure 124 of the LED 100 will be made. This stack is similar to the one previously described in relation to FIG. 16A. Furthermore, the first electrodes 112 and the hard mask 131 are made on the previously formed structure such that apertures formed in this mask 131 correspond to the patterns to be etched in the layer stack on which the hard mask 131 is formed in order to define the locations in which the gate 118 will penetrate the mesa structure 124 of the LED 100.

Figure 17B:
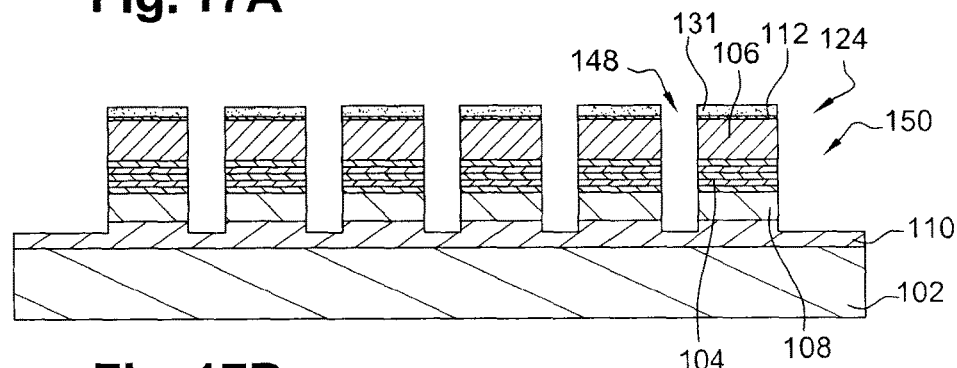

As depicted in FIG. 17B, an etching of the first p-doped semiconductor layer 115, the active layers 113, and the second n-doped semiconductor layer 111 and part of the thickness of the buffer layer 110 is then implemented according to the pattern defined by the hard mask 131, forming in the mesa structure 124 locations 148 in which the electrically conductive portions of the gate 118 are intended to penetrate through the mesa structure 124. This etching is also made on the periphery of the mesa structure 124 in order to form the locations 150 at which the second electrode 116 will be made. This etching is stopped at a depth level located in the buffer layer 110. This etching may however be stopped at another level, for example at the upper face of the buffer layer 110 or in the layer 111. The implemented etching is a dry etching, for example a reactive ion etching with a $Cl_2$ plasma.

Figure 17C:
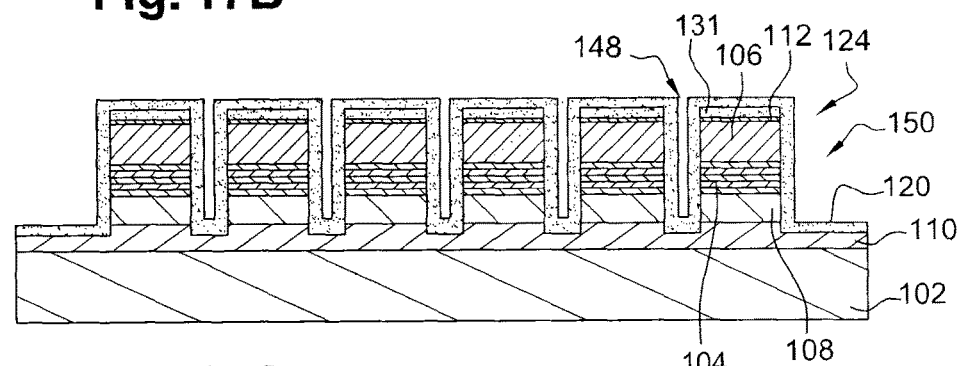

The dielectric passivation layer 120 is then deposited in a standard way on the structure, that is both on the mesa structure 124 and in the locations 148 and 150 by overlaying all the walls (sidewalls and bottom walls) of these locations (FIG. 17C). This dielectric passivation layer 120 is here for example $HfO_2$ deposited by ALD.

Figure 17D:
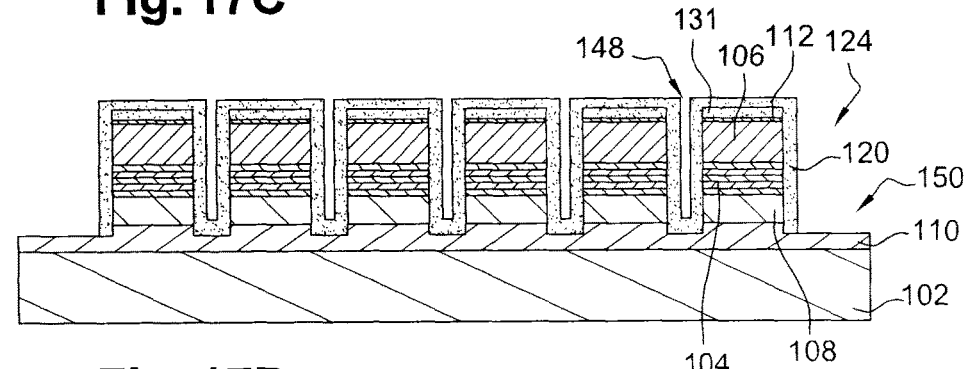
Figure 17E:
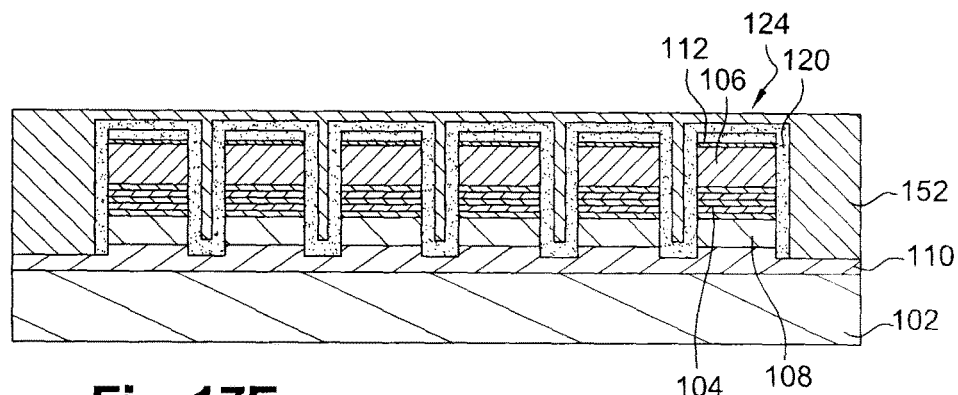
Figure 17F:
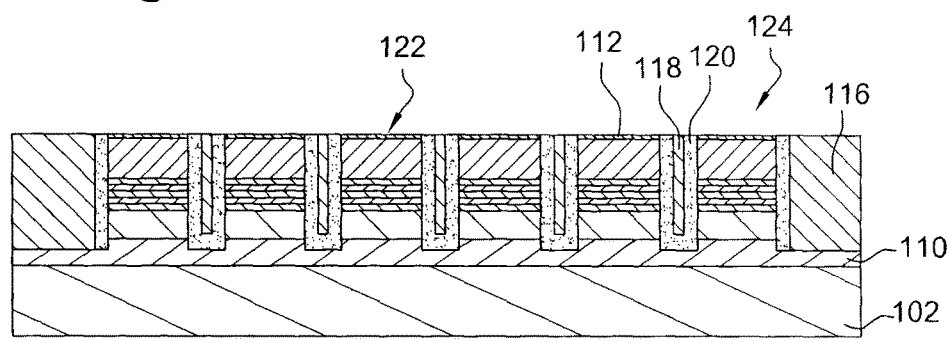

The parts of the dielectric passivation layer 120 overlaying the bottom walls of the locations 150 of the second electrode 116 are then etched, for example via a $Cl_2$-type plasma etching by masking the other parts of the dielectric passivation layer 120 to be kept, for example with a resin (FIG. 17D).

A full plate deposition of an electrically conductive material layer 152 is then made, filling the locations 148 and 150 (FIG. 17E), and then a CMP is implemented with a stop on the first electrodes 112, thus forming the second electrode 116 as well as the dielectric passivation layer 120.

As an alternative to GaN, to InGaN, and to AlGaN, the p-n or p-i-n junction of the optoelectronic device 100 can be made from ZnO. In order to make such a junction, a two-dimensional ZnO heterostructure comprising ZnCdO or ZnMgO quantum wells can first be made. A p-type implantation and then an annealing of this heterostructure can then be made, for example as described in FR 2 981 090 A1. A structure similar to the one depicted in FIG. 16A is then obtained, in which the layer 115 corresponds to a p-doped ZnO layer (for example obtained by phosphorous implantation), the active layers 113 correspond to ZnO/ZnCdO or ZnO/ZnMgO wells, and the layer 111 corresponds to an n-doped ZnO layer. Steps similar to those previously described in relation to FIGS. 16B to 16L can then be implemented from such a stack in order to complete the making of the device 100.

Figure 18:
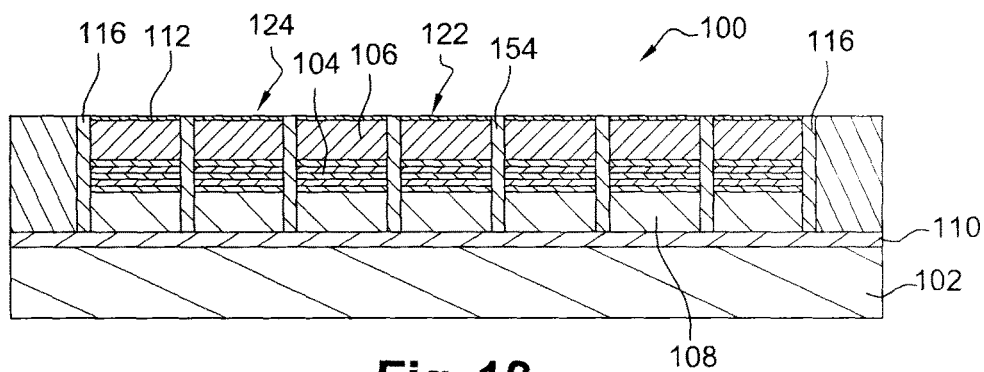
FIG. 18 schematically depicts an optoelectronic device according to an alternative embodiment.

In all the previously described embodiments and alternatives, each element comprising a gate and the passivation layer arranged around the gate and which enables a dopant ionization of the junction to be made through generating an electric field in the junction can be replaced by one or several metallic portions forming one or several Schottky contacts with the materials of the p-n or p-i-n junction. In this case, the metallic portions are directly in contact with the semiconducting materials of the junction, without an insulating material arranged between the semiconducting materials and the metallic material. To form such a Schottky contact, the metal used is selected from metals having a significant work function, such as for example tungsten the work function of which is equal to about 6.1 eV, or platinum. The choice of the metal used to form such Schottky contacts depends on the structure of the optoelectronic device 100, of the semiconductor materials used, etc. FIG. 18 depicts an exemplary embodiment of such an optoelectronic device 100, having here a structure similar to the previously described device 100 in relation to the FIGS. 13 and 14, but in which the mesa structure 124 is penetrated by metallic portions 154 forming Schottky contacts with the semiconductor materials forming the p-n junction.

As an alternative to the different previously described exemplary embodiments, the junction of the optoelectronic device 100 may be made of diamond, for example in the case of a LED or a photodiode able to perform a UV light emission or detection. The layer stack from which such a device can be made can be formed from a graphite substrate of a natural p-type. A p-type diamond growth is then performed, and then an n-type diamond layer is made, for example as described in the document by S. Koizumi et al., "Growth and characterization of phosphorous doped {111} homoepitaxial diamond thin films", Appl. Phys. Lett. 71, 1065 (1997), that is by CVD growth using phosphine as a dopant, on a thickness for example equal to about 300 nm. Steps similar to those previously described in relation to FIGS. 16B to 16L can then be implemented from such a stack in order to complete the making of the device 100.

With such a diamond-based optoelectronic device, the gate(s) or Schottky contacts are not used to ionize the acceptors but to ionize the donors being in the n-doped diamond and which have a high activation energy. Thus, the gate or the Schottky contact(s) are made such that they overlay at least one part of the side flanks of at least one part of the n-doped semiconductor portion located at the p-n or p-i-n junction, which will be positively biased (positive voltage Vg) in order to increase the internal quantum efficiency in the junction. In this configuration, the first semiconductor portion 106 is advantageously made with an n-type semiconductor.

Figure 19:
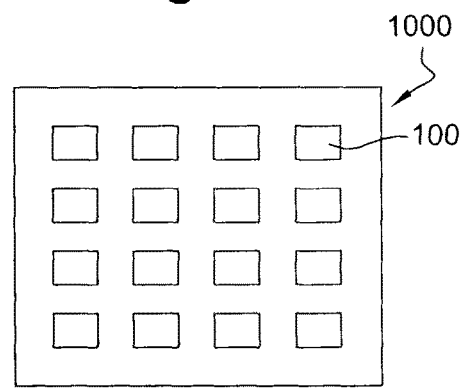
FIG. 19 schematically depicts an electronic device comprising several optoelectronic devices.

One or several LEDs 100 according to one of the different previously described embodiments can be integrated within a light emissive device 1000. FIG. 19 schematically depicts such a device 1000 comprising 9 LED 100 made on a same substrate 102 as a 3×3 matrix.

As an alternative to the different previously described exemplary embodiments, reference 100 can correspond not to one or several LEDs, but to one or several photodiodes comprising p-n or p-i-n junctions. As for the LEDs, the gate(s) or Schottky contact(s) are used in this case to ionize the dopants (acceptors or donors) and thus to adjust the doping in the junction used to make the photoelectrical conversion. For example, for a photodiode 100 for making a UV light detection, if AlGaN is used to make the p-n junction (for example made by MOCVD growth of n-type AlGaN with about 50% of silicium-doped aluminium with $10^{19}$ donors/cm$^3$ on a thickness of about 1 μm and then with $10^{17}$ donors/cm$^3$ on a thickness of about 500 nm, and then by growth of magnesium-doped p-type AlGaN with about $10^{19}$ acceptors/cm$^3$ on a thickness of about 300 nm), the problem related to the high acceptor activation energy in the p-type semiconductor can also be found with such a photodiode, limiting the performances for detecting UV light.

Similarly, the use of an n-type semiconductor having a high donor activation energy, for example diamond, is also possible for making a photodiode. In this case, the gate(s) or Schottky contacts enable these donors to be ionized in order to improve the conductivity of the n-type semiconductor. Moreover, the device 1000 depicted in FIG. 19 can correspond not to a light emissive device but to a photodetector device comprising several photodiodes 100.

Dopant ionization made thanks to the gate(s) or Schottky contact(s) addresses this problem in a way similar to the one previously described for the LEDs.

In the case of an optoelectronic device 100 for making a photoelectrical conversion such as a photodiode, the electrode(s) 112 being at the apex of the mesa structures are made from a transparent material having wavelengths intended to be detected and photo-electrically converted, for example ITO with a thickness equal to about 100 nm. The second electrodes 116 are used in this case as electron collectors.

The invention claimed is:

1. An optoelectronic device having at least one mesa structure including at least:
    a first and a second semiconductor portions, one being p-doped and the other being n-doped, and forming together a p-n junction,
    a first electrode electrically connected to the first semiconductor portion which is arranged between the second semiconductor portion and the first electrode,
    the optoelectronic device further comprising at least:
    a second electrode electrically connected to the second semiconductor portion,
    an element electrically insulated from the first semiconductor portion and the second semiconductor portion, and which is able to ionize dopants of at least one of the first and second semiconductor portions through generating an electric field in the at least one of the first and second semiconductor portions and which overlays at least one part of the side flanks of at least one part of the at least one of the first and second semiconductor portions and of at least one part of a space charge zone formed by the first and second semiconductor portions, and wherein upper faces of at least the first electrode and of the second electrode form a substantially planar continuous surface.

2. The optoelectronic device according to claim 1, wherein the element able to ionize dopants of the at least one of the first and second semiconductor portion comprises:
at least one dielectric passivation layer overlaying said at least one part of the side flanks of at least one part of the at least one of the first and second semiconductor portions and of at least one part of the space charge zone, and at least one electrically conductive gate such that the dielectric passivation layer is arranged between the gate and said at least one part of the at least one of the first and second semiconductor portions and between the gate and said at least one part of the space charge zone, and/or
at least one metallic portion overlaying said at least one part of the side flanks of at least one part of the at least one of the first and second semiconductor portions and of at least one part of the space charge zone and forming a Schottky contact with said at least one part of the at least one of the first and second semiconductor portions and with at least one part of the space charge zone.

3. The optoelectronic device according to claim 2, wherein:
a first part of the dielectric passivation layer laterally surrounds at least partly the first electrode, the first semiconductor portion and at least one part of the second semiconductor portion,
the gate laterally overlays the first part of the dielectric passivation layer,
a second part of the dielectric passivation layer laterally overlays the gate, and
the second electrode laterally overlays the second part of the dielectric passivation layer,
or wherein:
the metallic portion laterally surrounds at least partly the first electrode, the first semiconductor portion, and at least one part of the second semiconductor portion, and
the second electrode laterally overlays the metallic portion.

4. The optoelectronic device according to claim 2, comprising:
several mesa structures,
several dielectric passivation layers each overlaying at least one part of the side flanks of at least one part of the at least one of the first and second semiconductor portions and of at least one part of the space charge zone of one of the mesa structures and several electrically conductive gates such that each dielectric passivation layer is arranged between one of the gates and said at least one part of the at least one of the first and second semiconductor portions of one of the mesa structures and between one of the gates and said at least one part of the space charge zone of one of the mesa structures, or several metallic portions each overlaying at least one part of the side flanks of at least one part of the at least one of the first and second semiconductor portions and of at least one part of a space charge zone of one of the mesa structures,
wherein the second electrode is electrically connected to the second semiconductor portion of each mesa structure, and wherein the upper faces of at least the first electrode of each mesa structure and of the second electrode form the substantially planar continuous surface.

5. The optoelectronic device according to claim 4, wherein:
each mesa structure is at least partly laterally surrounded by a first part of one of the dielectric passivation layers,
each gate laterally overlays the first part of one of the dielectric passivation layers,
a second part of each dielectric passivation layer laterally overlays one of the gates, and
the second electrode laterally overlays the second parts of the dielectric passivation layers,
or wherein:
each mesa structure is at least partly laterally surrounded by one of the metallic portions, and
the second electrode laterally overlays the metallic portions.

6. The optoelectronic device according to claim 2, wherein:
the gate comprises at least one portion of at least one electrically conductive material extending in the mesa structure, or the metallic portion extends in the mesa structure, and
the second electrode is arranged around the mesa structure.

7. The optoelectronic device according to claim 2, comprising several mesa structures, and wherein:
the gate comprises several portions of at least one electrically conductive material extending in one or several of the mesa structures, or several metallic portions extend in one or several of the mesa structures, and
the second electrode is arranged around the or each mesa structure.

8. The optoelectronic device according to claim 2, further comprising an electrical contact arranged next to the mesa structure(s) and next to the second electrode, and to which the gate(s) or the metallic portion(s) are electrically connected.

9. The optoelectronic device according to claim 2, wherein the substantially planar continuous surface is further formed by upper faces of the gate(s) or the metallic portion(s), and/or by upper faces of the dielectric passivation layer(s).

10. The optoelectronic device according to claim 2, wherein the or each dielectric passivation layer overlays an upper face of the or each gate.

11. The optoelectronic device according to claim 1, further comprising at least one buffer layer comprising a semiconductor doped according to the same conductivity type as the second semiconductor portion and on which the second semiconductor portion and the second electrode are arranged next to each other.

12. The optoelectronic device according to claim 1, further comprising a second doped semiconductor layer comprising a structured upper face, a first protruding part of which forms the second semiconductor portion, and wherein the second electrode is arranged on at least a second part of the second doped semiconductor layer forming a depression of the structured face of the second doped semiconductor layer.

13. The optoelectronic device according to claim 1, wherein a first part of the second semiconductor portion arranged between a second part of the second semiconductor portion and the first semiconductor portion forms a recess regarding the second part of the second semiconductor portion, and wherein the second electrode is electrically connected to the second semiconductor portion at an upper face of the second part of the second semiconductor portion.

14. The optoelectronic device according to claim 1, wherein the first semiconductor portion is p-doped and comprises at least one semiconductor an acceptor activation energy of which is equal to or higher than about 200 meV, or wherein the first semiconductor portion is n-doped and comprises at least one semiconductor a donor activation energy of which is equal to or higher than about 200 meV.

15. An electronic device comprising one or several optoelectronic devices according to claim 1, wherein the one or several optoelectronic devices comprise one or several light emitting diodes, or one or several photodiodes, or one or several light emitting diodes and one or several photodiodes.

16. A method of light emission from an optoelectronic device according to claim 2, comprising implementing a polarization of the optoelectronic device by applying an electric voltage between the first electrode and the second electrode of the optoelectronic device, and:
   applying an electric potential difference between the at least one electrically conductive gate or the at least one metallic portion and one of the first or second electrode electrically connected to a p-doped semiconductor portion comprising one of the first or second semiconductor portion such that the electric potential applied to the at least one electrically conductive gate or the at least one metallic portion is equal to or lower than the electric potential applied to the one of the first or second electrode electrically connected to the p-doped semiconductor portion, or
   applying an electric potential difference between the at least one electrically conductive gate or the at least one metallic portion and the one of the first or second electrode electrically connected to an n-doped semiconductor portion comprising the other of the first or second semiconductor portion such that the electric potential applied to the at least one electrically conductive gate or the at least one metallic portion is equal to or higher than the electric potential applied to the one of the first or second electrode electrically connected to the n-doped semiconductor portion.

17. A method of photoelectric conversion from an optoelectronic device according to claim 2, comprising:
   applying an electric potential difference between the at least one electrically conductive gate or the at least one metallic portion and one of the first or second electrode electrically connected to a p-doped semiconductor portion comprising one of the first or second semiconductor portion such that the electric potential applied to the at least one electrically conductive gate or the at least one metallic portion is equal to or lower than the electric potential applied to the one of the first or second electrode electrically connected to the p-doped semiconductor portion, or
   applying an electric potential difference between the at least one electrically conductive gate or the at least one metallic portion and the one of the first or second electrode electrically connected to an n-doped semiconductor portion comprising the other of the first or second semiconductor portion such that the electric potential applied to the at least one electrically conductive gate or the at least one metallic portion is equal to or higher than the electric potential applied to the one of the first or second electrode electrically connected to the n-doped semiconductor portion.

18. A method for making an optoelectronic device comprising at least the steps of:
   making a layer stack including at least one first semiconductor layer arranged between a second semiconductor layer and an electrically conductive layer, one of the first and second semiconductor layers being p-doped and the other of the first and second semiconductor layers being n-doped,
   etching the layer stack, making at least one mesa structures including a first and a second semiconductor portions forming a p-n junction and a first electrode electrically connected to the first semiconductor portion,
   making an element electrically insulated from the first semiconductor portion and the second semiconductor portion, and which is able to ionize dopants of at least one of the first and second semiconductor portions through generating an electric field in the at least one of the first and second semiconductor portions and which overlays at least one part of the side flanks of at least one part of the at least one of the first and second semiconductor portions and of at least one part of a space charge zone formed by the first and second semiconductor portions,
   making a second electrode electrically connected to the second semiconductor portion,
   and wherein at least making the second electrode comprises a step of planarizing an electrically conductive material such that upper faces of at least the first electrode and of the second electrode form a substantially planar continuous surface.

* * * * *